US012628394B2

(12) United States Patent
Kumada

(10) Patent No.: US 12,628,394 B2
(45) Date of Patent: May 12, 2026

(54) SILICON CARBIDE SEMICONDUCTOR DEVICE AND METHOD FOR MANUFACTURING THE SAME

(71) Applicant: FUJI ELECTRIC CO., LTD.,
Kawasaki (JP)

(72) Inventor: Keishirou Kumada, Matsumoto (JP)

(73) Assignee: FUJI ELECTRIC CO., LTD.,
Kawasaki (JP)

( * ) Notice: Subject to any disclaimer, the term of this patent is extended or adjusted under 35 U.S.C. 154(b) by 683 days.

(21) Appl. No.: 17/679,904

(22) Filed: Feb. 24, 2022

(65) Prior Publication Data

US 2022/0336590 A1     Oct. 20, 2022

(30) Foreign Application Priority Data

Apr. 14, 2021     (JP) .................................. 2021-68560

(51) Int. Cl.
*H10D 30/66*          (2025.01)
*H01L 21/22*          (2006.01)
        (Continued)

(52) U.S. Cl.
CPC ........... *H10D 62/53* (2025.01); *H01L 21/221* (2013.01); *H10D 12/031* (2025.01);
        (Continued)

(58) Field of Classification Search
CPC . H01L 29/1095; H01L 29/7813; H10D 62/53; H10D 30/665; H10D 62/105
See application file for complete search history.

(56) References Cited

U.S. PATENT DOCUMENTS 9,704,980 B2     7/2017  Gouda
10,128,369 B2    11/2018  Takei et al.
        (Continued)

FOREIGN PATENT DOCUMENTS

JP     2013-074181 A     4/2013
JP     2015-095559 A     5/2015
        (Continued)

OTHER PUBLICATIONS

Defintion of "contact", retrieved from https://www.britannica.com/dictionary (2024). (Year: 2024).*
        (Continued)

*Primary Examiner* — Michele Fan

(57)          ABSTRACT

A silicon carbide semiconductor device includes an n-type drift layer disposed on an n-type silicon carbide substrate; an n-type current spreading layer disposed on a top surface of the drift layer, having a higher impurity concentration than the drift layer; a p-type base region disposed on a top surface of the current spreading layer; a p-type gate-bottom protection region located in the current spreading layer; a p-type base-bottom embedded region located in the current spreading layer, separated from the gate-bottom protection region to be in contact with a bottom surface of the base region; an insulated-gate electrode structure disposed in a trench penetrating the base region to reach the gate-bottom protection region, and a lower recombination region disposed in a lower portion of the drift layer, including crystal defects configured to recombine minority carriers injected into the drift layer.

17 Claims, 22 Drawing Sheets

(51) Int. Cl.

| | |
|---|---|
| *H10D 12/01* | (2025.01) |
| *H10D 62/17* | (2025.01) |
| *H10D 62/53* | (2025.01) |
| *H10D 62/832* | (2025.01) |
| *H10D 84/00* | (2025.01) |

(52) U.S. Cl.
CPC ......... *H10D 30/668* (2025.01); *H10D 62/393* (2025.01); *H10D 62/8325* (2025.01); *H10D 84/144* (2025.01)

(56) References Cited

U.S. PATENT DOCUMENTS

| | | | |
|---|---|---|---|
| 11,038,020 B2 | 6/2021 | Fujimoto | |
| 2013/0075783 A1 | 3/2013 | Yamazaki et al. | |
| 2016/0276470 A1 | 9/2016 | Gouda | |
| 2017/0025524 A1 | 1/2017 | Kinoshita et al. | |
| 2017/0263603 A1* | 9/2017 | Hata | H01L 27/0727 |
| 2017/0301789 A1* | 10/2017 | Takei | H03K 17/145 |
| 2018/0233564 A1* | 8/2018 | Kumada | H10D 30/0297 |
| 2018/0350962 A1* | 12/2018 | Naito | H01L 21/3225 |
| 2019/0096989 A1* | 3/2019 | Yoshida | H01L 27/0761 |
| 2019/0165102 A1 | 5/2019 | Fujimoto | |
| 2021/0183995 A1* | 6/2021 | Kobayashi | H10D 84/144 |
| 2021/0257455 A1 | 8/2021 | Fujimoto | |

FOREIGN PATENT DOCUMENTS

| | | |
|---|---|---|
| JP | 2017-191918 A | 10/2017 |
| JP | 2019102493 A | 6/2019 |
| JP | 2021-028962 A | 2/2021 |
| WO | 2016039071 A1 | 3/2016 |

OTHER PUBLICATIONS

Japanese Office Action issued in counterpart Japanese Application No. 2021-068560 dated Feb. 4, 2025.

* cited by examiner

SILICON CARBIDE SEMICONDUCTOR DEVICE AND METHOD FOR MANUFACTURING THE SAME

CROSS REFERENCE TO RELATED APPLICATIONS

This application is based upon and claims the benefit of priority from the prior Japanese Patent Application No. 2021-68560 filed on Apr. 14, 2021, the entire contents of which are incorporated herein by reference.

BACKGROUND OF THE INVENTION

1. Field of the Invention

The present invention relates to a silicon carbide (SiC) semiconductor device and a method for manufacturing the same.

2. Description of the Related Art

Commercially available silicon carbide (SiC) single-crystal substrates contain a number of dislocations, including basal plane dislocations (BPD). Such dislocations continuously propagate into an epitaxial layer epitaxially grown on the substrate. Therefore, it is known that the semiconductor device fabricated on the epitaxial substrate adversely affects the characteristics of the semiconductor device.

In a SiC semiconductor device such as a MOS field effect transistor (FET), a built-in diode having a p-n junction is formed on an epitaxial substrate. The basal plane dislocations cause degradation of the forward characteristics of the built-in diode which operates in a bipolar mode during turn-off state. For example, minority carriers, which are holes in an n-type semiconductor region, generated by flowing forward current during bipolar operation diffuses in the epitaxial substrate. When the minority carriers recombine at the basal plane dislocation to give recombination energy to the basal plane dislocation, the stacking fault may expand in the epitaxial substrate starting from the basal plane dislocation. As the stacking fault expands, the forward voltage increases and the forward resistance increases when the forward current flows through the built-in diode. As described above, when the device characteristics degrade, the loss generated increases with time and the heat divergence also increases, causing a failure of the semiconductor device.

The stacking faults expand from the interface between the n-type substrate and the drift layer which is the n-type epitaxial layer. By arranging an $n^+$-type buffer layer having a high impurity concentration between the substrate and the drift layer, the holes injected from the surface electrode side can be recombined in the buffer layer. Since the recombination energy is released in the buffer layer, the expansion of the stacking faults can be prevented. However, in order to maintain the high breakdown voltage, thickness of the buffer layer is required to be about 10 μm, and thus, the manufacturing cost of the epitaxial substrate may increase.

JP 2019-102493 A discloses a method in which the recombination centers (lifetime killers) are formed by implanting hydrogen ions (protons) in the vicinity of the interface between the substrate and the n-type boundary layer. In the method disclosed in JP 2019-102493 A, since the recombination centers are introduced on the entire interface between the substrate and the n-type boundary layer, the on-resistance of the MOSFET may increase. WO 2016-039071 A1 proposes a method of decreasing the reverse recovery loss of the built-in diode by implanting protons or helium ions into the interface of p-n junction at the bottom of the base region of the planar MOSFET to provide the recombination centers. In the method disclosed in WO 2016-039071 A1, since the recombination centers are formed at the bottom of the base region, it is difficult to sufficiently decrease the holes injected into the drift layer.

SUMMARY OF THE INVENTION

An aspect of the present invention inheres in a SiC semiconductor device, including: (a) a drift layer of a first conductivity type disposed above a silicon carbide substrate of the first conductivity type; (b) a current spreading layer of the first conductivity type disposed on a top surface of the drift layer, having a higher impurity concentration than the drift layer; (c) a base region of a second conductivity type disposed on a top surface of the current spreading layer; (d) a gate-bottom protection region of the second conductivity type located in the current spreading layer; (e) a base-bottom embedded region of the second conductivity type located in the current spreading layer, separated from the gate-bottom protection region to be in contact with a bottom surface of the base region; (f) an insulated-gate electrode structure disposed in a trench penetrating the base region to reach the gate-bottom protection region, and (g) a lower recombination region disposed in a lower portion of the drift layer, including crystal defects configured to recombine minority carriers injected into the drift layer.

Another aspect of the present invention inheres in a method for manufacturing a SiC semiconductor device, including: (a) forming an element structure in an active area of a silicon carbide substrate of a first conductivity type, the element structure including, a drift layer of the first conductivity type epitaxially grown on the silicon carbide substrate; a current spreading layer of the first conductivity type disposed on a top surface of the drift layer, having a higher impurity concentration than the drift layer; a base region of a second conductivity type disposed on a top surface of the current spreading layer; a gate-bottom protection region of the second conductivity type located in the current spreading layer; a base-bottom embedded region of the second conductivity type located in the current spreading layer, separated from the gate-bottom protection region to be in contact with a bottom surface of the base region; and an insulated-gate electrode structure disposed in a trench penetrating the base region to reach the gate-bottom protection region, (b) polishing a bottom surface of the silicon carbide substrate, after forming the element structure; and (c) selectively implanting hydrogen ions or helium ions into a lower portion of the drift layer from the polished bottom surface of the silicon carbide substrate to selectively form a lower recombination region, which includes crystal defects for recombining minority carriers, in the lower portion of the drift layer.

BRIEF DESCRIPTION OF THE DRAWINGS

FIG. 8 is a schematic cross-sectional view illustrating an example of a process following FIG. 7 in the manufacturing method of the semiconductor device according to the embodiment of the present invention;

FIG. 13 is a schematic cross-sectional view illustrating an example of a process following FIG. 12 in the manufacturing method of the semiconductor device according to the embodiment of the present invention;

FIG. 17 is a schematic cross-sectional view illustrating an example of a process following FIG. 16 in the manufacturing method of the semiconductor device according to the embodiment of the present invention;

DETAILED DESCRIPTION

Figure 1:
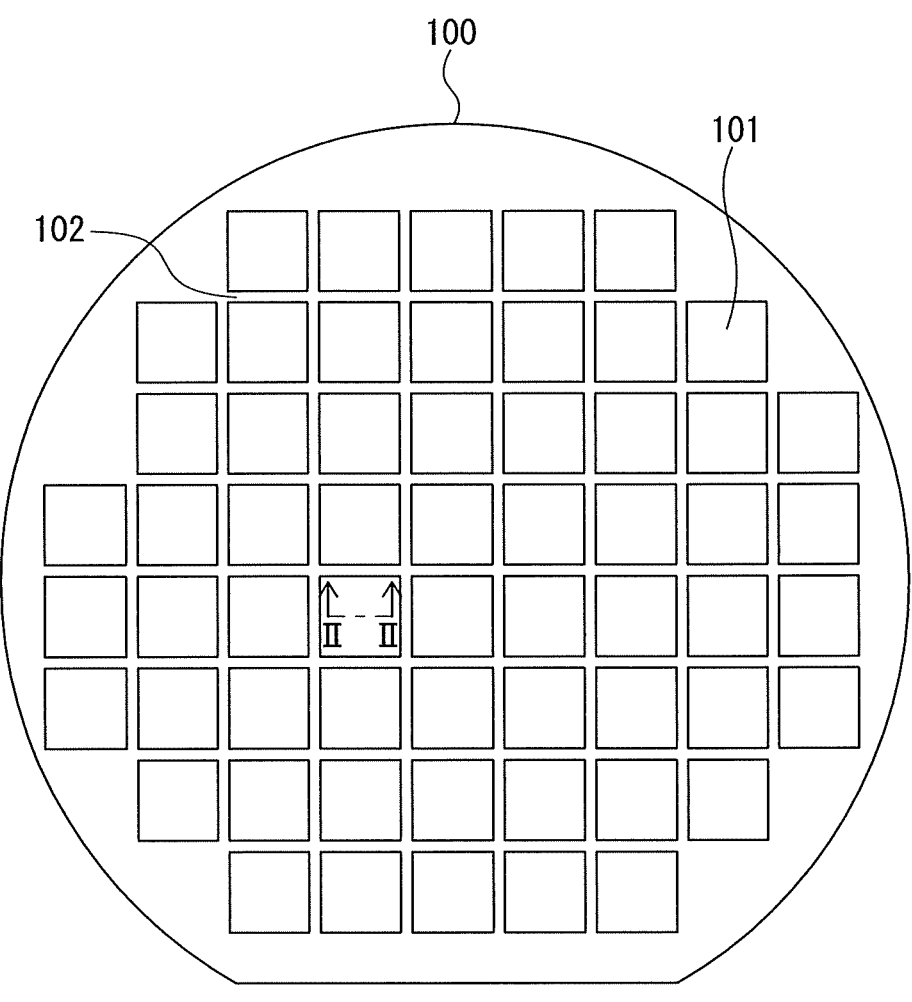
FIG. 1 is a schematic plan view illustrating an example of a semiconductor device according to an embodiment of the present invention.

Hereinafter, embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the present specification, the source region of the MOS transistor is the "one main region (first main region)" that can be selected as the emitter region of the insulated gate bipolar transistor (IGBT). Further, in a thyristor such as a MOS-controlled electrostatic induction thyristor (SI thyristor), one main region can be selected as a cathode region. The drain region of the MOS transistor is the "other main region (second main region)" of the semiconductor device, which can be selected as the collector region in the IGBT and the anode region in the thyristor. As used herein, the term "main area" means either the first main area or the second main area, which is appropriate from the common general technical knowledge of those skilled in the art.

Further, in the following descriptions, the terms relating to directions, such as "top and bottom" are merely defined for illustration purposes, and thus, such definitions do not limit the technical spirit of the present invention. Therefore, for example, when the paper plane is rotated by 90 degrees, the "top and bottom" are read in exchange to the "left and right". When the paper plane is rotated by 180 degrees, the "top" is changed to the "bottom", and the "bottom" is changed to the "top". Further, in the following description, the case where a first conductivity type is n-type and a second conductivity type is p-type will be exemplarily described. However, it is also possible to select the conductivity type in an inverse relationship so that the first conductivity type is p-type and the second conductivity type is n-type. Further, the superscript "+" or "−" added to the mark "n" or "p" denotes that a semiconductor region has relatively high or low impurity concentration than a region without the superscript "+" or "−" added. It should be noted that semiconductor regions denoted by the same mark, such as "n", do not necessarily have exactly the same impurity concentration.

<Structure of Semiconductor Device>

The SiC crystal has polytypes, and the main polytypes are a 3 c cubic crystal and 4H, 6H hexagonal crystals. Forbidden band widths at room temperature are reported to be 2.23 electron volts for 3C-SiC, 3.26 electron volts for 4H-SiC and 3.02 electron volts for 6H-SiC, respectively. In the embodiment of the present invention, description will be made using the 4H-SiC.

Figure 2:
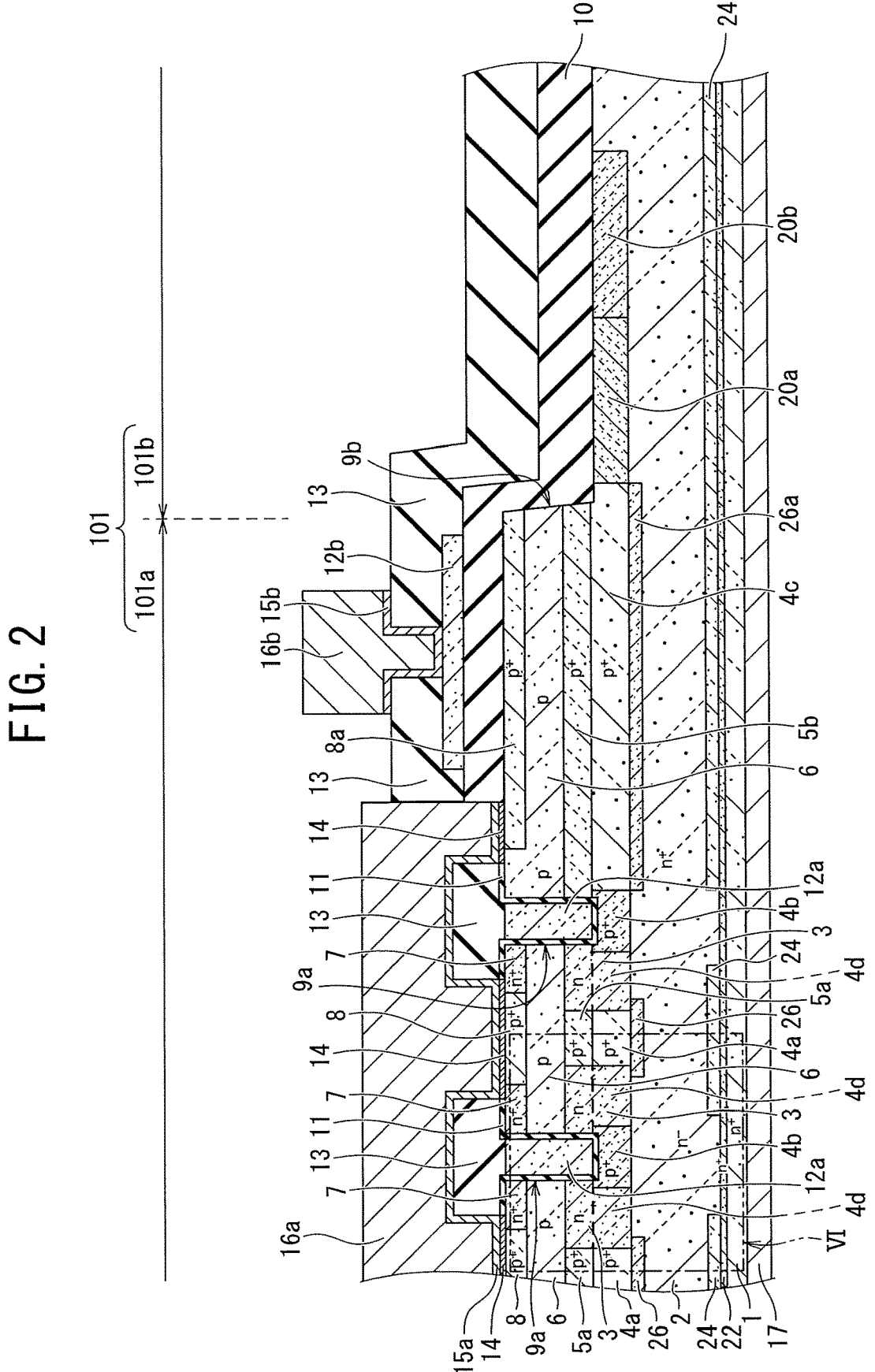
FIG. 2 is a schematic cross-sectional view taken along the line II-II in FIG. 1.

As illustrated in FIG. 1, a SiC semiconductor substrate (substrate) 100 for manufacturing a SiC semiconductor device according to an embodiment of the present invention includes a plurality of chip regions 101 and a dicing lane 102. For example, each of the chip regions 101 has a rectangular planar shape and is arranged on the substrate 100 in a matrix shape. The dicing lane 102 is arranged in a grid shape so as to surround each of the chip regions 101. As illustrated in FIG. 2, the chip region 101 is provided with an active area 101*a* including an active element and an outer-edge area 101*b* having an edge-termination structure for breakdown-voltage. FIG. 2 illustrates the semiconductor device which includes a MOSFET having a trench gate structure as an active element, provided on a first conductivity type (n⁻-type) drift layer 2, and electric-field relaxation regions 20*a*, 20*b* as the edge-termination structure.

As illustrated in FIG. 2, a second conductivity type (p-type) base region 6 is arranged on a top surface of the drift layer 2. The drift layer 2 and the base region 6 are provided with epitaxial growth layers (hereinafter, referred to as "epitaxial layers") made of SiC. A p⁺-type base contact region 8 having a higher impurity concentration than the base region 6 is selectively disposed on the base region 6. An n⁺-type first main region (source region) 7 having a higher impurity concentration than the drift layer 2 is selectively disposed on the base region 6 so as to be in contact with the base contact regions 8.

A trench 9*a* having a width of 1 μm or less is disposed so as to penetrate the base region 6 from the top surfaces of the source region 7 and the base region 6. That is, the source regions 7 and the base region 6 are in contact with a sidewall of the trench 9*a*. A gate insulating film 11 is formed on a bottom surface and the sidewall of the trench 9*a*. A gate electrode 12*a* is filled in the trench 9*a* via the gate insulating film 11 to implement an insulated-gate electrode-structure (11, 12*a*). For the gate insulating film 11, in addition to a silicon oxide (SiO₂) film, a dielectric film, such as a silicon oxynitride (SiON) film, a strontium oxide (SrO) film, a silicon nitride (Si₃N₄) film, an aluminum oxide (Al₂O₃) film, a magnesium oxide (MgO) film, an yttrium oxide (Y₂O₃) film, a hafnium oxide (HfO₂) film, a zirconium oxide (ZrO₂) film, a tantalum oxide (Ta₂O₅) film, and a bismuth oxide (Bi₂O₃) film, may be adopted. Moreover, a single-layer film of any one of the above-mentioned dielectric films or a composite film in which the plural dielectric films are laminated, may be used. For a material of the gate electrode 12*a*, for example, a polysilicon layer doped with impurities, such as phosphorus (P), boron (B) and the like, at a high concentration, that is a doped polysilicon layer, may be used.

An n-type current spreading layer (CSL) 3 having a higher impurity concentration than the drift layer 2 is selectively formed on an upper portion of the drift layer 2. The bottom of the trench 9*a* reaches the current spreading layer 3. It is noted that the current spreading layer 3 does not necessarily have to be formed. When the current spreading layer 3 is not formed, the bottom of the trench 9*a* reaches the drift layer 2. A p⁺-type gate-bottom protection region 4*b* is disposed in the current spreading layer 3 so as to be in contact with the bottom of the trench 9*a*. In the current spreading layer 3, a p⁺-type first embedded region 4*a* is disposed below the base contact region 8 at the same depth as the gate-bottom protection region 4*b* and away from the gate-bottom protection region 4*b*. A p⁺-type second embedded region 5*a* is disposed in an upper portion of the current spreading layer 3 so as to be in contact with a top surface of the first embedded region 4*a* and a bottom surface of the base region 6. The second embedded region 5*a* is also disposed below the base contact region 8. The first embedded region 4*a* and the second embedded region 5 implement a base-bottom embedded region (4*a*, 5*a*). A p⁺-type connecting portion 4*d* is disposed for selectively connecting the first embedded region 4*a* and the gate-bottom protection region 4*b* in an extending direction of the trench 9*a* to the paper plane. An upper recombination region 26 is disposed so as to contact a bottom surface of the first embedded region 4*a* of the base-bottom embedding region (4*a*, 5*a*). The upper recombination region 26 is preferably formed so as to cover the bottom surface and a bottom edge of the first embedded region 4*a*.

An interlayer insulating film 13 is arranged on the top surface of the gate electrode 12*a*. For the interlayer insulating film 13, a silicon oxide film doped with boron (B) and phosphorus (P), that is BPSG, may be used. However, for the interlayer insulating film 13, a silicon oxide film doped with phosphorus (P), that is PSG, a non-doped SiO₂ film called "NSG", in which phosphorus (P) or boron (B) is not contained, a silicon oxide film doped with boron (B), that is BSG, a Si₃N₄ film, or the like, may be used. Alternatively, a composite film in which the above-mentioned films are laminated, may be adopted.

As illustrated in FIG. 2, a source contact layer 14 is disposed to physically contact the source region 7 and the base contact region 8 which are exposed in an opening formed in the interlayer insulating film 13. A barrier metal layer 15*a* is disposed to cover the interlayer insulating film 13 and the source contact layer 14. A first main electrode (source electrode) 16*a* is electrically connected to the source region 7 and the base contact region 8 via the barrier metal layer 15*a* and the source contact layer 14. For example, a nickel silicide (NiSiₓ) film may be used for the source contact layer 14, and a titanium nitride (TiN) film or a titanium (Ti) film may be used for the barrier metal layer 15*a*. An aluminum (Al) film or an aluminum-silicon (Al—Si) film may be used for the source electrode 16*a*. The source electrode 16*a* is arranged separately from a gate surface electrode (not illustrated).

A base contact region 8*a* is disposed on the base region 6 in the active area 101*a* near the outer-edge area 101*b*. An interconnection layer 12*b* is arranged on a top surface of the base contact region 8*a* via a field oxide film 10, and a gate-electrode pad 16*b* is arranged on a top surface of the interconnection layer 12*b* via a barrier-metal layer 15*b*. Although not illustrated, the gate-electrode pad 16*b* is electrically connected to the gate electrode 12*a* via the interconnection layer 12*b*. The interlayer insulating film 13 and the field oxide film 10 extend into the outer-edge area 101*b*. Further, in the active area 101*a* near the outer-edge area 101*b*, a base-bottom embedded region (4*c*, 5*b*) provided with the second embedded region 5*b* and the first embedded region 4*c* extends so as to be in contact with a bottom surface of the base region 6. An upper recombination region 26*a* is disposed so as to be in contact with a bottom surface of the first embedded region 4*c* of the base-bottom embedded region (4*c*, 5*b*).

An n⁺-type buffer layer 22 and an n⁺-type second main region (drain region) 1 is arranged under the drift layer 2. The drain region 1 is provided with the SiC semiconductor substrate (substrate). Below the base-bottom embedded region (4*a*, 5*a*), a lower recombination region 24 is selectively formed at a lower portion of the drift layer 2. A space between the adjacent lower recombination regions 24 is aligned so as to face the gate-bottom protection region 4*b*. Further, a lower recombination region 24*a* is formed at the lower portion of the drift layer 2 below the base-bottom embedded region (4*c*, 5*b*) so as to extend into the outer-edge area 101*b*.

The second main electrode (drain electrode) 17 is disposed on a bottom surface of the drain region 1. For the drain electrode 17, for example, a single-layer film made of gold (Au) or a metal film in which Ti, nickel (Ni), and Au are laminated in this order may be used, and further, a metal film, such as molybdenum (Mo), tungsten (W) or the like, may be laminated as the lowermost layer of the drain electrode 17. Furthermore, a drain contact layer may be formed between the drain region 1 and the drain electrode 17. The drain contact layer may be a nickel silicide ($NiSi_x$) film, for example.

As illustrated in FIG. 2, in the outer-edge area 101b, a mesa groove 9b is formed to penetrate the base region 6 from the top surface of the base region 6 and to reach the first embedded region 4c. The width of the mesa groove 9b in one chip region 101 is, for example, in a range of 5 μm or more and 200 μm or less. In the outer-edge area 101b, electric-field relaxation regions 20a, 20b are formed as a termination structure so as to be exposed on a bottom surface of the mesa-groove 9b. Each of the electric-field relaxation regions 20a, 20b, for example, has a junction termination extension (JTE) structure provided with a plurality of p-type spatial modulation portions. Each of the electric field relaxation regions 20a and 20b is not limited to the JTE structure, and a plurality of p-type guard rings may be formed in concentric ring shapes. In an outer end of the outer-edge area 101b, an $n^+$-type channel stopper may be formed in a concentric ring shape in the upper portion of the drift layer 2. Instead of the $n^+$-type channel stopper, a $p^+$-type channel stopper may be formed.

For example, the drift layer 2 has an impurity concentration of $1\times10^{15}$ $cm^{-3}$ or more and $2\times10^{16}$ $cm^{-3}$ or less, and a thickness of 1 μm or more and 100 μm or less. An optimum thickness and impurity concentration are selected according to a breakdown voltage specification of a built-in diode to be described later. The base region 6 has an impurity concentration of $1\times10^{17}$ $cm^{-3}$ or more and $\times10^{18}$ $cm^{-3}$ or less. The base contact region 8 has an impurity concentration of $5\times10^{18}$ $cm^{-3}$ or more and $5\times10^{20}$ $cm^{-3}$ or less, and the source region 7 has an impurity concentration of $5\times10^{20}$ $cm^{-3}$ or more and $5\times10^{20}$ $cm^{-3}$ or less. The current spreading layer 3 has an impurity concentration of $5\times10^{16}$ $cm^{-3}$ or more and $5\times10^{17}$ $cm^{-3}$ or less, and the gate-bottom protection region 4b and the first and second embedded regions 4a, 5a of the base-bottom embedded region (4a, 5a) have comparable impurity concentrations of $1\times10^{17}$ $cm^{-3}$ or more and $1\times10^{19}$ $cm^{-3}$ or less. The buffer layer 22 has an impurity concentration of $5\times10^{17}$ $cm^{-3}$ or more and $1\times10^{18}$ $cm^{-3}$ or less, and a thickness of 0.5 μm or more and 1 μm or less. The drain region 1 has an impurity concentration of $1\times10^{18}$ $cm^{-3}$ or more and $1\times10^{19}$ $cm^{-3}$ or less.

During operation of the semiconductor device according to the embodiment, a positive voltage is applied to the drain electrode 17 with the source electrode 16a as the ground potential and a positive voltage equal to or higher than a threshold value is applied to the gate electrode 12a. Then, an inversion layer, that is a channel, is induced in the base region 6 at the sidewall of the trench 9a to turn on the semiconductor device. The inversion layer is formed in the region of the base region 6 in contact with the sidewall of the trench 9a as an interface between the gate insulating film 11 and the base region 6 where the base region 6 faces the gate electrode 12a. In the on-state, a current flows from the drain electrode 17 to the source electrode 16a via the drain region 1, the drift layer 2, the current spreading layer 3, the inversion layer in the base region 6, and the source region 7. On the other hand, when the voltage applied to the gate electrode 12a is less than the threshold value, the inversion layer is not induced in the base region 6. Thus, the semiconductor device is turned off and no current flows from the drain electrode 17 to the source electrode 16a.

Further, as illustrated in FIG. 2, the p-type base region 6 is formed on the n-type drift layer 2, thereby forming a p-n junction of a built-in diode, or a body diode. That is, the built-in diode is provided with the base contact region 8, the base region 6, the base-bottom embedded region (4a, 5a), the current spreading layer 3, the drift layer 2, the buffer layer 22, and the drain region 1. The drain region 1 provided with the semiconductor substrate functions as a "cathode region" of the built-in diode, and the drift layer 2 and the current spreading layer 3 on the buffer layer 22 function as a "carrier-transport region" in which carriers transport by drifting. The base contact region 8, the base region 6, and the base-bottom embedded region (4a, 5a) function as an "anode region" of the built-in diode. Therefore, the drain electrode 17 formed on the lower surface of the drain region 1 functions as a "cathode electrode", and the carriers transported to the drain region 1 are extracted to the external circuit via the drain electrode 17. The source electrode 16a formed on the upper surface of the base contact region 8 functions as an "anode electrode" of the built-in diode, and the carriers are supplied to the base contact region 8 and the base region 6 from an external circuit via the source electrode 16a. The majority carriers (electrons) supplied from the drain region 1 transport in the drift layer 2 with a drift electric field. The minority carriers (holes) are injected into the drift layer 2 from the base contact region 8 through the base region 6.

Figure 3:
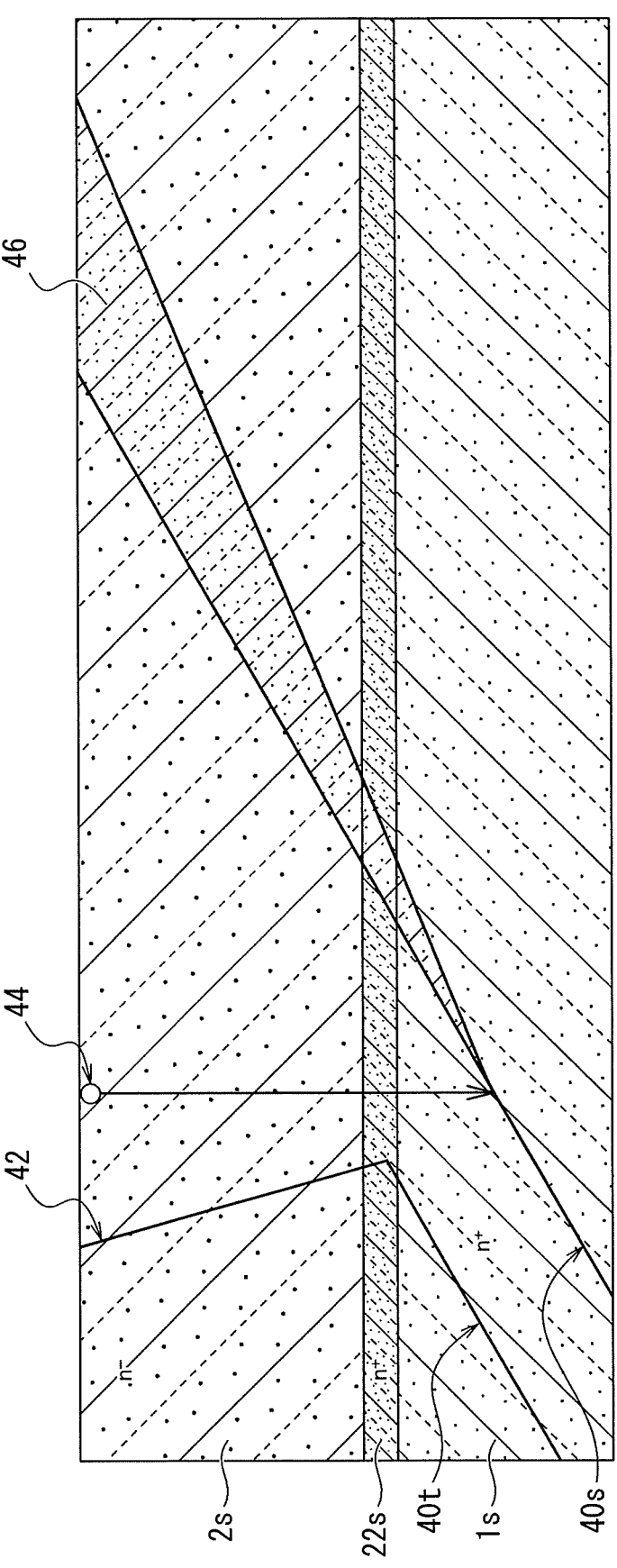
FIG. 3 is a schematic cross-sectional view illustrating an example of an expansion of stacking fault in a conventional semiconductor device.

In a general SiC substrate, basal plane dislocations reside in an order of 1000 pieces/$cm^2$. As illustrated in FIG. 3, when an $n^+$-type buffer layer 22s and a $n^-$-type epitaxial layer 2s are epitaxially grown on the $n^+$-type substrate 1s, most of the basal plane dislocations 40t may be converted into threading dislocations 42 in the buffer layer 22s. The buffer layer 22s functions as a dislocation conversion layer and has a thickness of about 1 μm or less. On the other hand, some basal dislocations 40s propagate from the substrate is beyond the buffer layer 22s to the epitaxial layer 2s. When a p-n diode is formed using such an epitaxial substrate (1s, 22s, 2s), the basal plane dislocation 40s near the interface between the substrate is and the buffer layer 22s can be a starting point of expansion of a stacking fault by flowing current. That is, the basal plane dislocation 40s serves as the starting point of expansion of the stacking fault, by injecting holes into the epitaxial layer 2s from the p-type anode region formed on the upper portion of the epitaxial layer 2s. In addition, the threading dislocation 42 converted from the basal plane dislocation 40t do not expand to the stacking fault.

For example, a hole 44 is injected into the n-type epitaxial layer 2s as a "minority carrier" from the anode region of the p-n diode. An electron, which is a majority carrier in the conduction band generated by the forward current, recombines with the hole 44 at the electronic level of the stacking fault, i.e., the recombination center, generated out of the basal plane dislocation 40s, thereby causing the expansion of the stacking fault. Since the recombination energy caused by the recombination center is small, the expansion of the stacking fault does not occur unless the hole density reaching the stacking fault exceeds a threshold value. The threshold value of the hole density is said to be about $1\times10^{15}$ $cm^{-3}$. The epitaxial layer 2s has a low impurity density, and the diffusion depth of hole injected into the epitaxial layer 2s is about 10 μm. Therefore, when the epitaxial layer 2s having a thickness of about 10 μm is used as the carrier-transport region of the p-n diode, the hole injected from the anode region can reach the inside of the substrate is through the buffer layer 22s with a sufficiently high density. The stacking fault 46 may expand in the epitaxial layer 2s from the basal plane dislocation 40s as a starting point located near the interface between the buffer layer 22s and the substrate 1s.

Since the stacking fault causes a high resistance region, the current will flow in the region without the stacking fault. As a result, in the p-n diode, degradations of the forward characteristics, such as an increase in the on-voltage (forward voltage) and an increase in the on-resistance, may occur.

Figure 4:
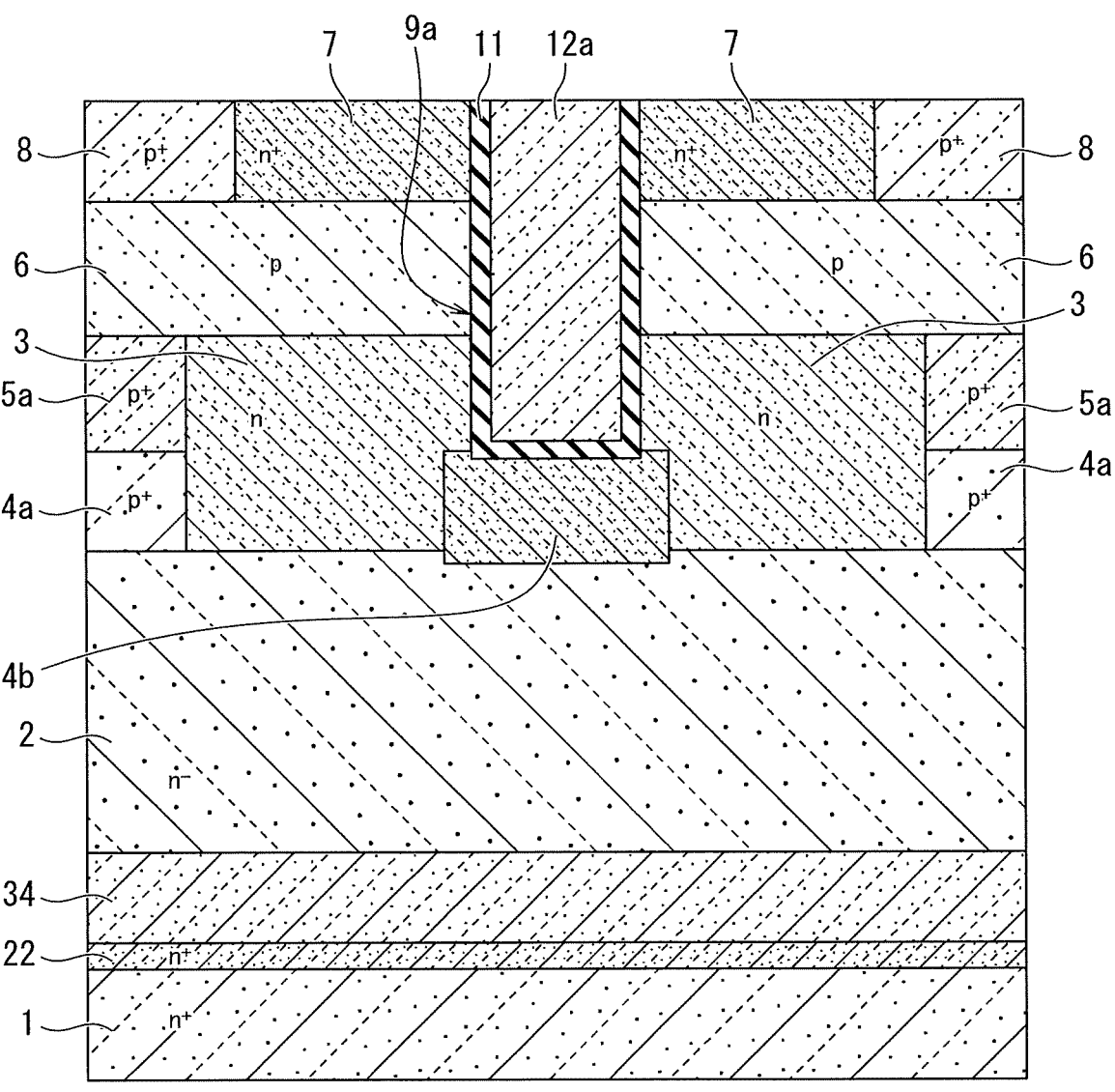
FIG. 4 is a schematic cross-sectional view illustrating an example of a structure for preventing the expansion of the stacking fault in the conventional SiC semiconductor device.
Figure 5:
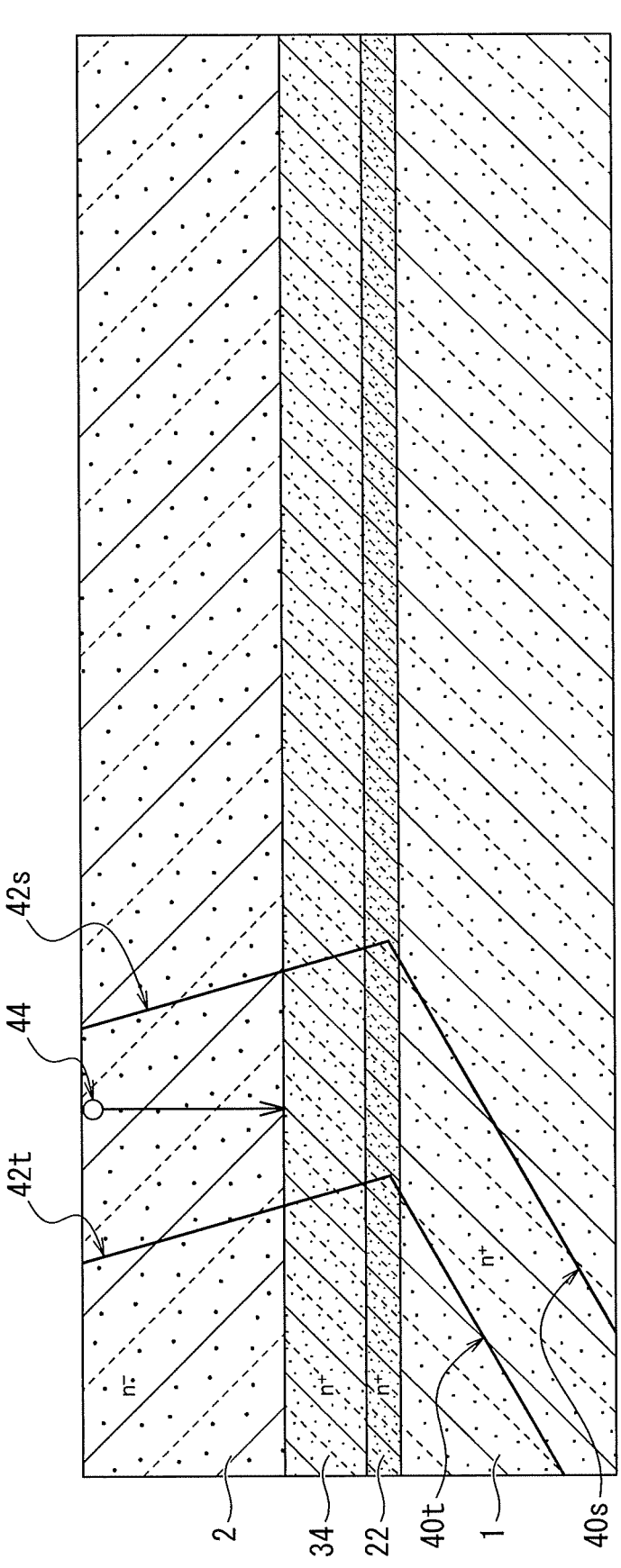
FIG. 5 is a schematic cross-sectional view illustrating an example of promotion of recombination in the semiconductor device in FIG. 4.

In a conventional semiconductor device, as illustrated in FIG. 4, an n$^+$-type recombination-promoting layer 34 of about several μm is disposed between the buffer layer 22 and the drift layer 2. For example, the drift layer 2 is about 10 μm, and the recombination-promoting layer 34 is 3 μm or more and 7 μm or less. FIG. 5 is an enlarged view illustrating an n-type laminated structure provided with the drain region 1, the buffer layer 22, the recombination-promoting layer 34, and the drift layer 2 of the semiconductor device illustrated in FIG. 4. As illustrated in FIG. 5, the hole 44 as the minority carrier injected into the drift layer 2 from the anode region of the built-in diode of FIG. 2 disappears by recombining with the electron as the majority carrier in the recombination-promoting layer 34. Therefore, since both the basal plane dislocations 40t, 40s residing in the drain region 1 are converted into the threading dislocations 42t, 42s, it is possible to prevent from being expanded to the stacking faults. In order to sufficiently promote the recombination of holes 44, it is necessary to epitaxially grow the recombination promoting layer 34 sufficiently thick, which leads to an increase in manufacturing cost.

Figure 6:
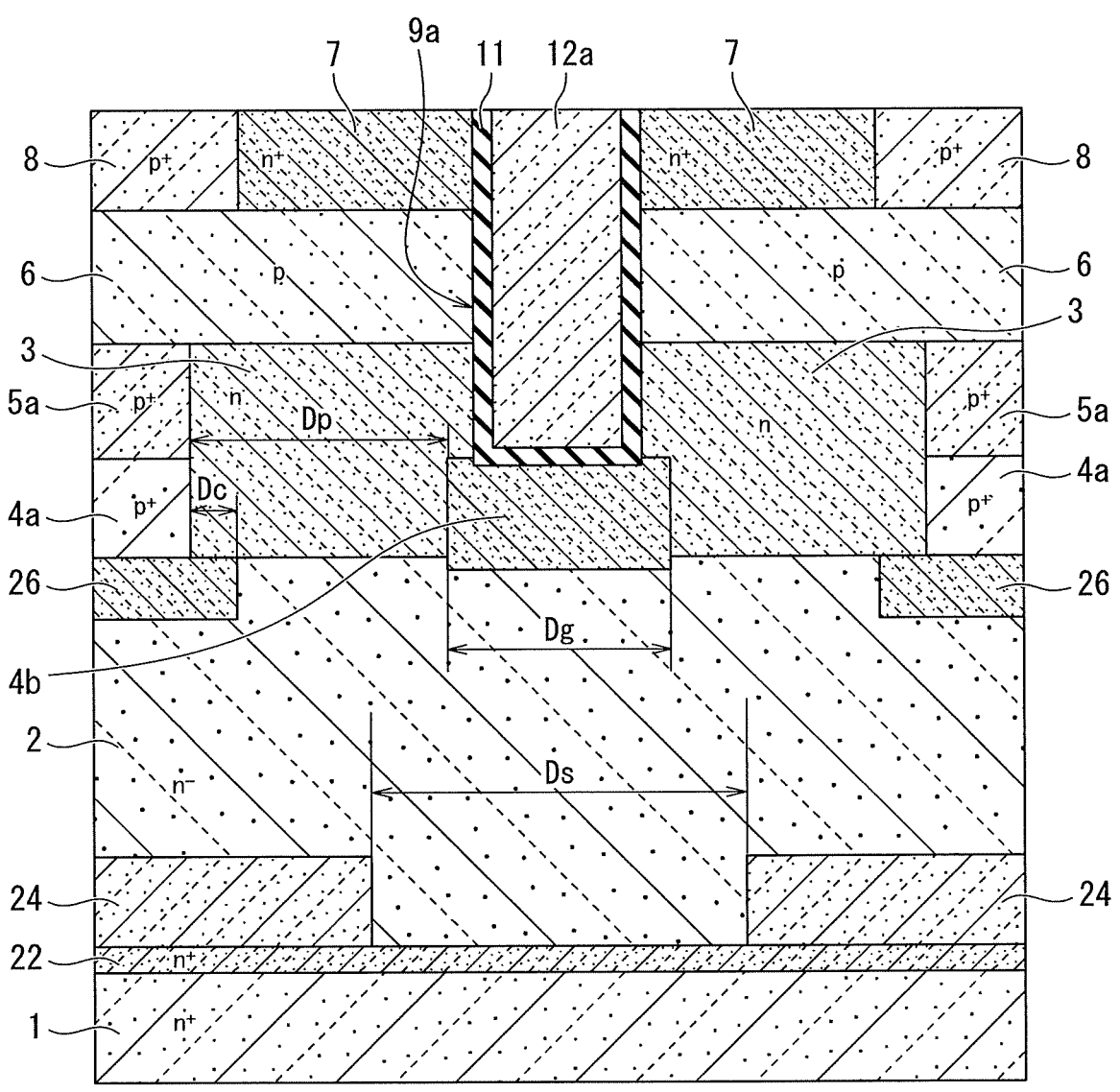
FIG. 6 isan enlarged view of portion VI in FIG. 2.

FIG. 6 is an enlarged view of portion VI of the semiconductor device illustrated in FIG. 2. As illustrated in FIG. 6, in the semiconductor device according to the embodiment, the upper recombination region 26 and the lower recombination region 24 having crystal defects are formed as the recombination centers for recombination of the holes being the minority carriers. The crystal defects are provided with implanted light element ions, for example, protons (hydrogen ions) or helium ions. The upper recombination region 26 is selectively provided so as to cover the bottom surface and the bottom edge of the first embedded region 4a of the base-bottom embedded region (4a, 5a) to protrude toward the opposite gate-bottom protection region 4b with a protrusion width Dc. The lower recombination region 24 is in contact with the upper surface of the buffer layer 22 in the lower portion of the drift layer 2 below the base-bottom embedded region (4a, 5a), and is selectively formed to be separated from each other by a separation width Ds. In addition, the lower recombination region 24 may be disposed so as to reside inside the drift layer 2 and not to be in contact with the buffer layer 22. Thus, the function of the buffer layer 22 for converting dislocations in the substrate can be maintained. However, in order to prevent the holes as the minority carriers from reaching the buffer layer 22, the bottom of the lower recombination region 24 and the top of the buffer layer 22 may be separated by 3 μm or less.

In the upper recombination region 26, the holes injected into the drift layer 2 from the base region 6, especially through the base-bottom embedded region (4a, 5a), may be recombined by the crystal defects. The protrusion width Dc of the side surface of the upper recombination region 26 is preferably not more than a half of a current spreading width Dp between the base bottom embedded region (4a, 5a) and the gate-bottom protection region 4b. When the protrusion width Dc is equal to or smaller than 0, that is, when the upper recombination region 26 has a width smaller than the base bottom embedded region (4a, 5a), the holes injected into the drift layer 2 through the base-bottom embedded region (4a, 5a) cannot be sufficiently decreased. Since the upper recombination region 26 including the crystal defects has a high resistance, when the protrusion width Dc is larger than half of the current spreading width Dp in which the main current path of the semiconductor device is formed, the on-resistance of the MOSFET and the forward voltage of the built-in diode may increase. The upper recombination region 26 preferably has an area density of crystal defects, that is, implanted protons or helium ions, in a range of $5 \times 10^{10}$ cm$^{-2}$ or more and $2 \times 10^{11}$ cm$^{-2}$ or less, and a thickness in a range of 0.2 μm or more and 0.5 μm or less. In such ranges of area density and thickness, the holes can be sufficiently recombined, and the on-resistance of the MOSFET and the forward voltage of the built-in diode can be prevented from increasing.

In the lower recombination region 24, the holes injected into the drift layer 2 from the base region 6 without being recombined in the upper recombination region 26 are recombined by the crystal defects. A space between the adjacent lower recombination regions 24 is placed so as to face the gate-bottom protection region 4b. That is, the lower recombination region 24 is placed so as to face the base-bottom embedded region (4a, 5a) with a width wider than the base-bottom embedded region (4a, 5a). The separation width Ds of a space between the adjacent lower recombination regions 24 may be desirably larger than a width Dg of the gate-bottom protection region 4b in order to prevent from increasing the resistance of the region in the drift layer 2 immediately below the gate-bottom protection region 4b. Further, in order to sufficiently recombine the holes, the separation width Ds is set to be equal to or less than (Dg+Dp), and the side surface of the lower recombination region 24 is placed closer to the gate-bottom protection region 4b than a middle position between the first embedded region 4a and the gate-bottom protection region 4b. That is, the end of the lower recombination region 24 is positioned on a side close to the gate-bottom protection region 4b between the base-bottom embedded region (4a, 5a) and the gate-bottom protection region 4b in a plan view. Further, the lower recombination region 24 preferably has an area density of the crystal defects, that is, the implanted protons or helium ions, in a range of $5 \times 10^{11}$ cm$^{-2}$ or more and $2 \times 10^{12}$ cm$^{-2}$ or less, and a thickness in a range of 0.5 μm or more and 1.0 μm or less. In such ranges of area density and thickness, the holes can be sufficiently recombined, and the on-resistance of the MOSFET and the forward voltage of the built-in diode can be prevented from increasing.

<Manufacturing Method of Semiconductor Device>

Next, a manufacturing method of the SiC semiconductor device according to the embodiment will be given by taking a trench-gate MOSFET as an example, with reference to the cross-sectional views of FIGS. 7 to 17. Note that the manufacturing method of the trench-gate MOSFET described below is merely an example and may be achieved by various other manufacturing methods including a modification as long as the gist described in the claims is included.

Figure 7:
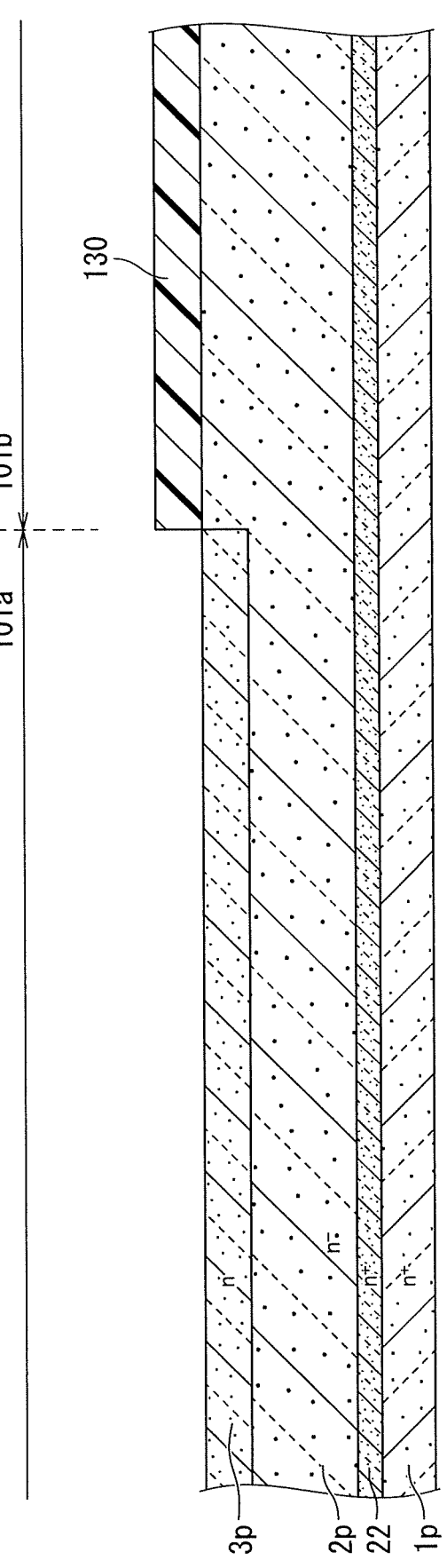
FIG. 7 is a schematic cross-sectional view illustrating an example of a process in a manufacturing method of the semiconductor device according to the embodiment of the present invention.

First, an n$^+$-type SiC semiconductor substrate (substrate) 1p in which n-type impurities such as nitrogen (N) are doped, is prepared. An n$^+$-type buffer layer 22 and an n$^-$-type drift layer 2p is epitaxially grown in series on a top surface of the substrate 1p. Then, a top surface of the drift layer 2p is coated with a photoresist film and a photoresist pattern 130 is delineated on the photoresist film by photolithography technology and the like. Using the delineated photoresist pattern 130 as an ion-implantation mask, n-type impurity ions, such as nitrogen (N) and the like, are selectively implanted into the active area 101a in the drift layer 2p from an upper side of the drift layer 2p by multiple-energy ion implantation. Thus, as illustrated in FIG. 7, an n-ion implanted layer 3p is formed on the active area 101a in the drift layer 2.

Figure 8:
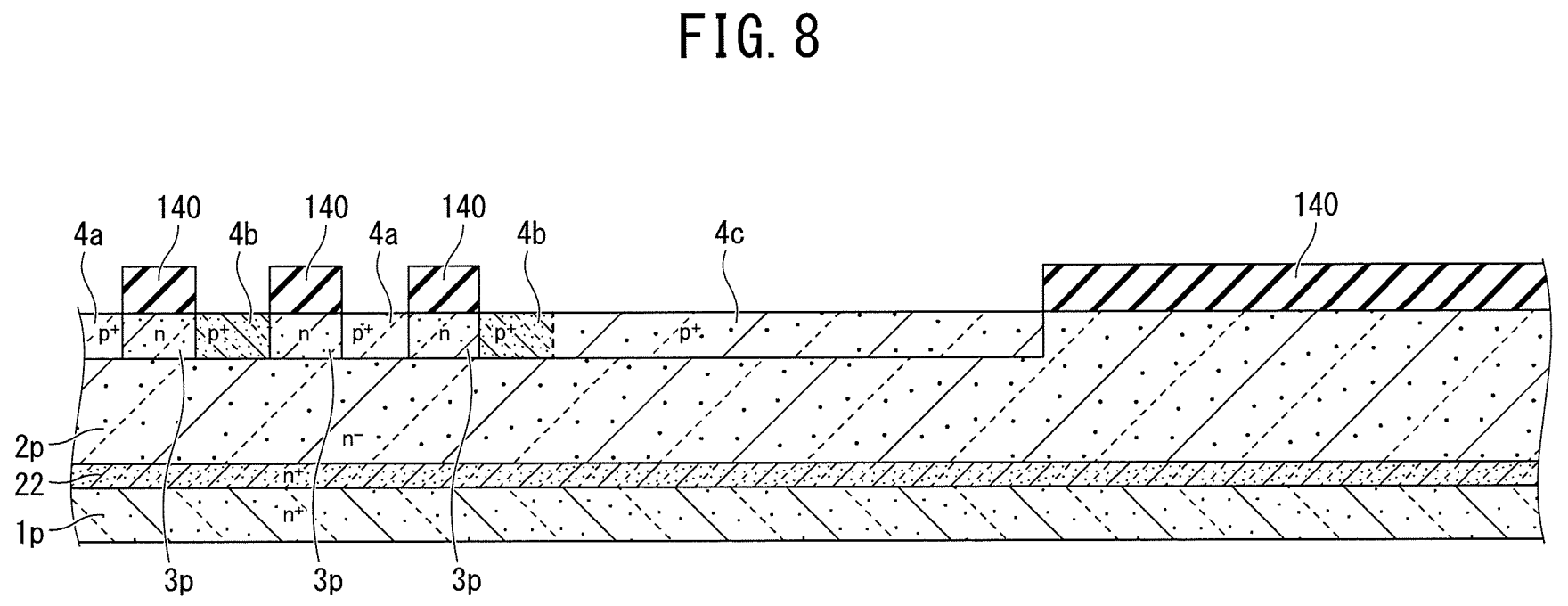

After removing the photoresist pattern 130, an oxide film made of $SiO_2$ is deposited on top surfaces of the n-ion implanted layer 3p and the drift layer 2p by chemical vapor deposition (CVD) technology and the like. A top surface of the oxide film is coated with a photoresist film and an oxide pattern 140 is delineated on the oxide film by photolithography technology, dry etching technology and the like. Using the delineated oxide pattern 140 as an ion-implantation mask, p-type impurity ions, such as aluminum (Al) and the like, is implanted into the n-ion implanted layer 3p by multiple-energy ion implantation. As a result, as illustrated in FIG. 8, the first embedded region 4a, the gate-bottom protection region 4b and the first embedded region 4c are selectively formed in the n-ion implanted layer 3p. Although not illustrated, the connecting portion 4d illustrated in FIG. 2 is also formed in the p-ion implantation process.

After removing the oxide pattern 140, an n-type epitaxial layer 5e is grown on top surfaces of the first embedded region 4a, 4c, the gate-bottom protection region 4b and the drift layer 2p. A top surface of the grown epitaxial layer 5e is coated with a photoresist film and a photoresist pattern is delineated on the photoresist film by photolithography technology and the like. Using the delineated photoresist pattern as an ion-implantation mask, n-type impurity ions, such as nitrogen (N) and the like, are selectively implanted into an upper portion of the epitaxial layer 5e in the active area 101a from an upper side of the epitaxial layer 5e by multiple-energy ion implantation to form an n-ion implanted layer 5p.

Figure 9:
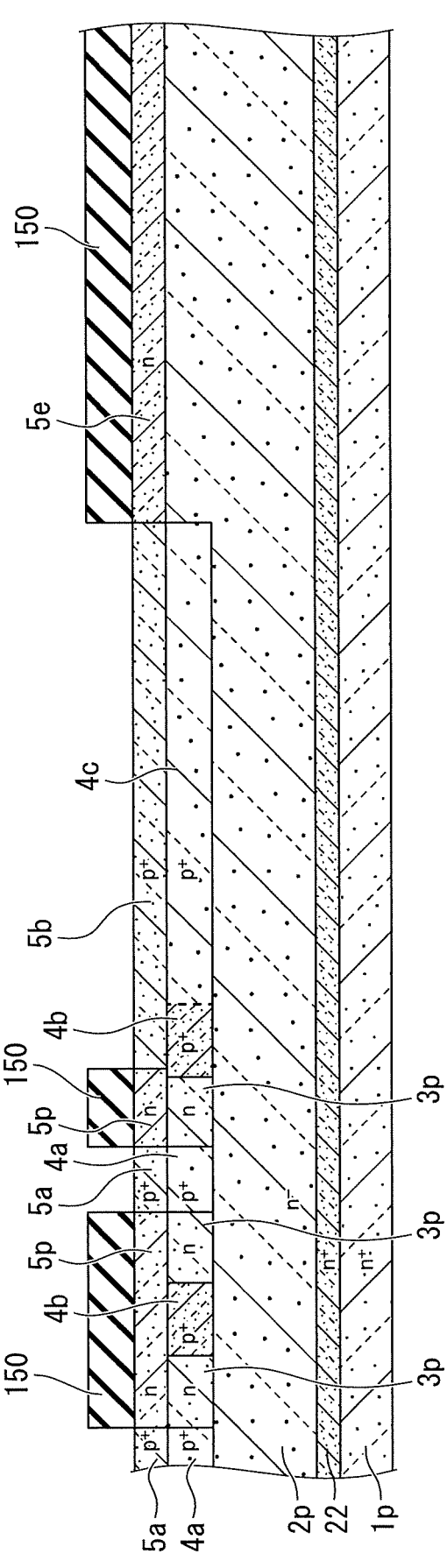
FIG. 9 is a schematic cross-sectional view illustrating an example of a process following FIG. 8 in the manufacturing method of the semiconductor device according to the embodiment of the present invention.

After removing the photoresist pattern used as the ion-implantation mask, an oxide film made of $SiO_2$ is deposited on top surfaces of the n-ion implanted layer 5p and the epitaxial layer 5e, illustrated in FIG. 9, by CVD technology and the like. A top surface of the oxide film is coated with a photoresist film and an oxide pattern 150 is delineated on the oxide film by photolithography technology, dry etching technology and the like. Using the delineated oxide pattern 150 as an ion-implantation mask, p-type impurity ions, such as aluminum (Al) and the like, are selectively implanted in the n-ion implanted layer 5p by multiple-energy ion implantation. As a result, a second embedded region 5a, 5b on the respective first embedded region 4a, 4c are selectively formed in the n-ion implanted layer 5p, as illustrated in FIG. 9.

Figure 10:
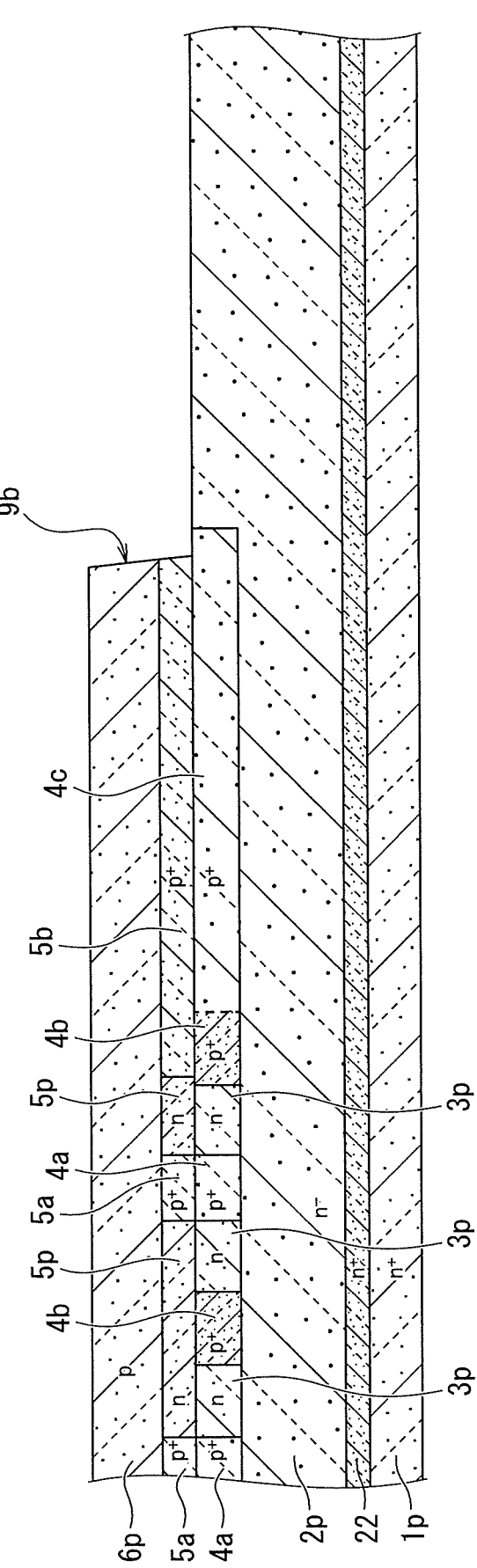
FIG. 10 is a schematic cross-sectional view illustrating an example of a process following FIG. 9 in the manufacturing method of the semiconductor device according to the embodiment of the present invention.

After removing the oxide pattern 150, a p-type epitaxial layer 6p is epitaxially grown on top surfaces of the second embedded regions 5a, 5b, the n-ion implanted layer 5p and the epitaxial layer 5e. An oxide film made of $SiO_2$ is deposited on a top surface of the grown epitaxial layer 6p by CVD technology and the like. A top surface of the oxide film is coated with a photoresist film and an oxide pattern is delineated on the oxide film by photolithography technology, dry etching technology and the like. Using the delineated oxide pattern as an etching mask, the epitaxial layer 6p, a part of the second embedded region 5b, and the epitaxial layer 5e are selectively etched by dry etching technology and the like in the outer-edge area 101b. As a result, a mesa groove 9b is formed as illustrated in FIG. 10. In the active area 101a, the epitaxial layer 6p, the second embedded region 5a, the n-ion implanted layer 5p, and the second embedded region 5b remain, and in the outer-edge area 101b, the end portion of the first embedded region 4c and the top surface of the drift layer 2 are exposed to a bottom surface of the mesa groove 9b.

After removing the oxide pattern used as the etching mask, an oxide film is deposited on the top surface of the epitaxial layer 6p and the bottom surface of the mesa groove 9b by CVD technology and the like. A top surface of the oxide film is coated with a photoresist film and an oxide pattern is delineated on the oxide film by photolithography technology, dry etching technology and the like. Using the delineated oxide pattern as an ion-implantation mask, n-type impurity ions, such as phosphorus (P) and the like, are implanted into the epitaxial layer 6p from the upper side of the epitaxial layer 6p by multiple-energy ion implantation. As a result, an n-ion implanted layer is formed in an upper portion of the epitaxial layer 6p in the active area 101a.

Figure 11:
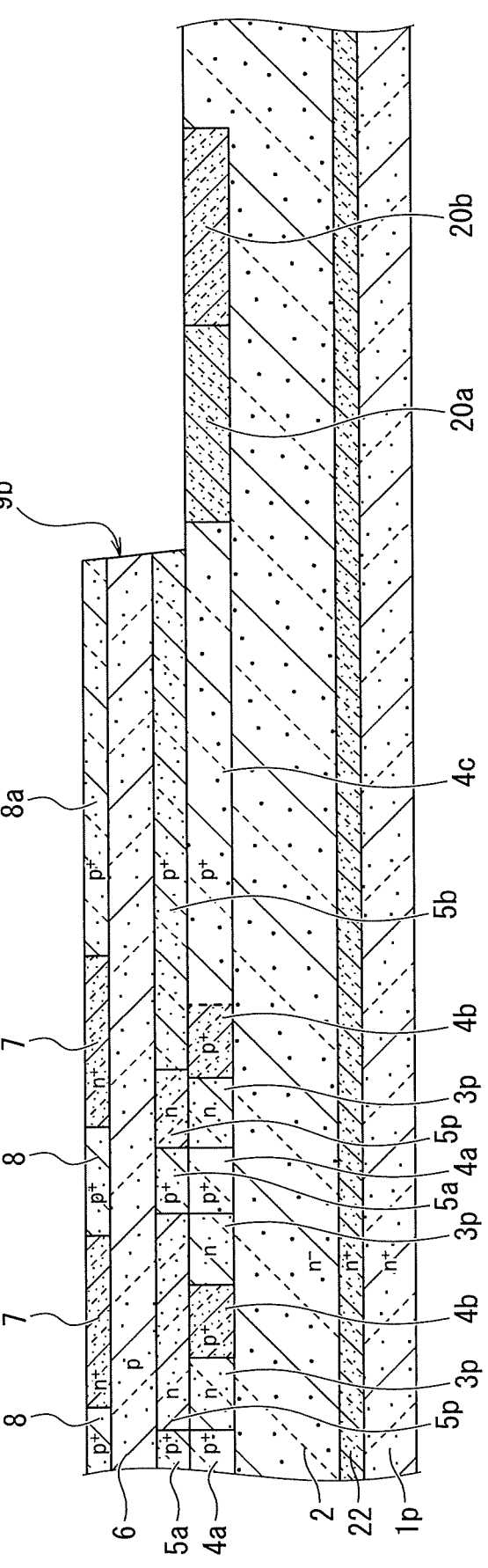
FIG. 11 is a schematic cross-sectional view illustrating an example of a process following FIG. 10 in the manufacturing method of the semiconductor device according to the embodiment of the present invention.

After removing the oxide pattern used as the ion-implantation mask, an oxide film is deposited on a top surface of the n-ion implanted layer and the bottom surface of the mesa groove 9b by CVD technology and the like. A top surface of the oxide film is coated with a photoresist film and an oxide pattern is delineated on the oxide film by photolithography technology, dry etching technology and the like. Using the delineated oxide pattern as an ion-implantation mask, p-type impurity ions, such as aluminum (Al) and the like, are selectively implanted into the n-ion implanted layer from the upper side of the n-ion implanted layer by multiple-energy ion implantation. As a result, the source region 7 and the base contact region 8, 8a are formed in the upper portion of the base region 6 as illustrated in FIG. 11. The source region 7 is formed above the n-ion implanted layer 5p, and the base contact region 8 in contact with the source region 7 is formed above the second embedded region 5a. Also, the base contact region 8a is formed above the second embedded region 5b.

After removing the oxide pattern used as the ion-implantation mask, top surfaces of the source region 7 and the base contact regions 8, 8a, and the bottom surface of the mesa groove 9b are coated with a photoresist film and a photoresist pattern is delineated on the photoresist film by photolithography technology and the like. Using the delineated photoresist pattern as an etching mask, p-type impurity ions, such as aluminum (Al) and the like, are selectively implanted into the bottom of the mesa groove 9b from the upper side of the mesa groove 9b by multiple-energy ion implantation to form the electric-field relaxation regions 20a, 20b. After removing the photoresist pattern used as the ion-implantation mask, as illustrated in FIG. 11, the electric-field relaxation regions 20a, 20b are formed as the termination structure so as to be exposed on the bottom surface of the mesa groove 9b.

Figure 12:
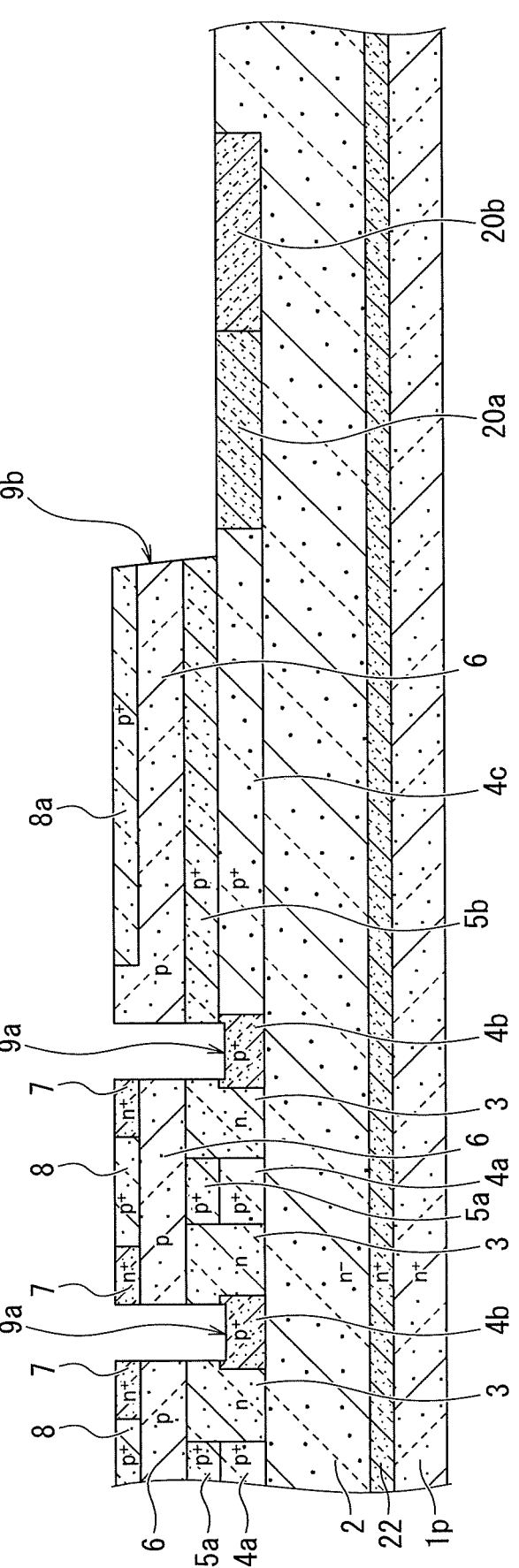
FIG. 12 is a schematic cross-sectional view illustrating an example of a process following FIG. 11 in the manufacturing method of the semiconductor device according to the embodiment of the present invention.

Continuously, an oxide film is deposited on the top surfaces of the source region 7 and the base contact regions 8, 8a, and the bottom surface of the mesa groove 9b by CVD technology and the like. A top surface of the oxide film is coated with a photoresist film and an oxide pattern is delineated on the oxide film by photolithography technology, dry etching technology and the like. Using the delineated oxide pattern as an etching mask, the trench 9a is selectively formed by dry etching technology. As illustrated in FIG. 12, the n-type current spreading layer 3 implemented by the n-ion implanted layer 3p and the n-ion implanted layer 5p is formed on the top surface of the drift layer 2, and the trench 9a penetrates the source region 7 and the base region 6 to reach the gate-bottom protection region 4b formed in the current spreading layer 3.

After removing the oxide pattern used as the etching mask, a carbon (C) film is deposited by carbon sputtering technology and the like so as to cover the trench 9a and the mesa groove 9b. Then, the implanted n-type impurity ions and the implanted p-type impurity ions are simultaneously activated by activation annealing. An oxide film made of $SiO_2$ is deposited on an exposed surface after removing the carbon film by CVD technology and the like. A top surface of the oxide film is coated with a photoresist film and a photoresist pattern is delineated on the photoresist film by photolithography technology and the like. Using the delineated photoresist pattern as an etching mask, the oxide film is selectively etched to form the field oxide film 10, illustrated in FIG. 13, extending from the bottom surface of the mesa groove 9b to the top surface of the base contact region 8a.

Figure 13:
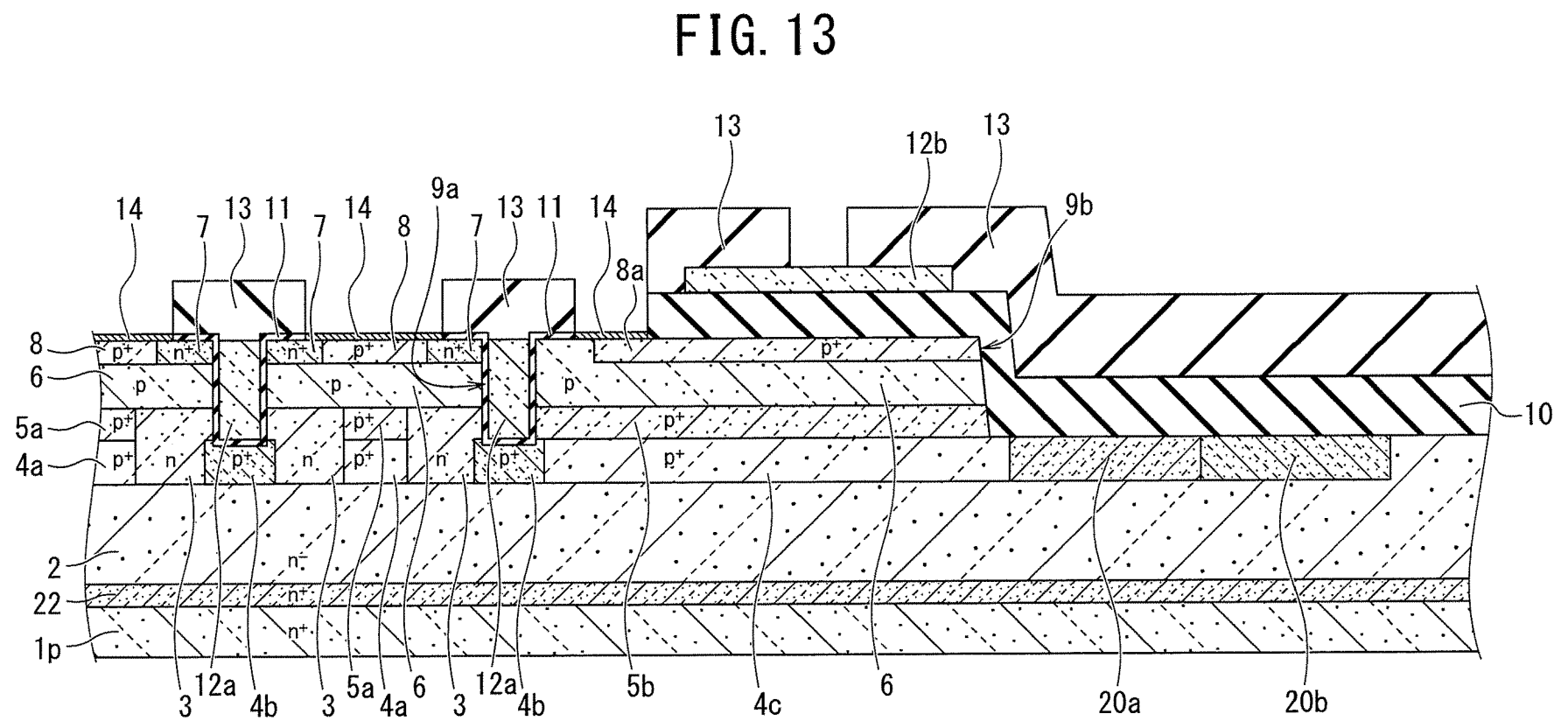

A gate insulating film, such as a $SiO_2$ film and the like, is formed on the bottom surface and sidewall of the trench 9a, and on the top surfaces of the source region 7 and the base contact region 8, by thermal oxidation method, chemical vapor deposition (CVD) technology and the like. Then, a polysilicon layer (a doped polysilicon layer) in which impurities such as phosphorus (P) and boron (B) are doped at a high concentration is deposited so as to fill the trench 9a by CVD technology and the like. Thereafter, a part of the polysilicon layer and a part of the gate insulating film are selectively removed by photolithography technology and dry etching to form the insulated-gate electrode structure (11, 12a) illustrated in FIG. 13. The insulated-gate electrode structure (11, 12a) is implemented by the gate insulating film 11 of the $SiO_2$ film and the gate electrode 12a of the polysilicon layer. Further, in the vicinity of the mesa groove 9b, the interconnection layer 12b electrically connected to the gate electrode 12a is formed on the top surface of the field oxide film 10. Then, an insulating film is deposited on a top surface of the insulated-gate electrode structure (11, 12a) provided with the gate electrode 12a and the gate insulating film 11 by CVD technology and the like. For the insulating film, boro-phospho-silicate glass (BPSG), NSG and the like may be used. Then, a part of the deposited insulating film is selectively removed by photolithography technology, dry etching technology and the like. As a result, as illustrated in FIG. 13, the interlayer insulating film 13 in which a source-electrode contact-hole and a gate-electrode-pad contact-hole are opened is formed. Although not illustrated, a gate-electrode contact-hole is also opened in the interlayer insulating film 13 so as to expose a part of a gate surface electrode connected to the gate electrode 12a at a position different from the source-electrode contact-hole.

Figure 14:
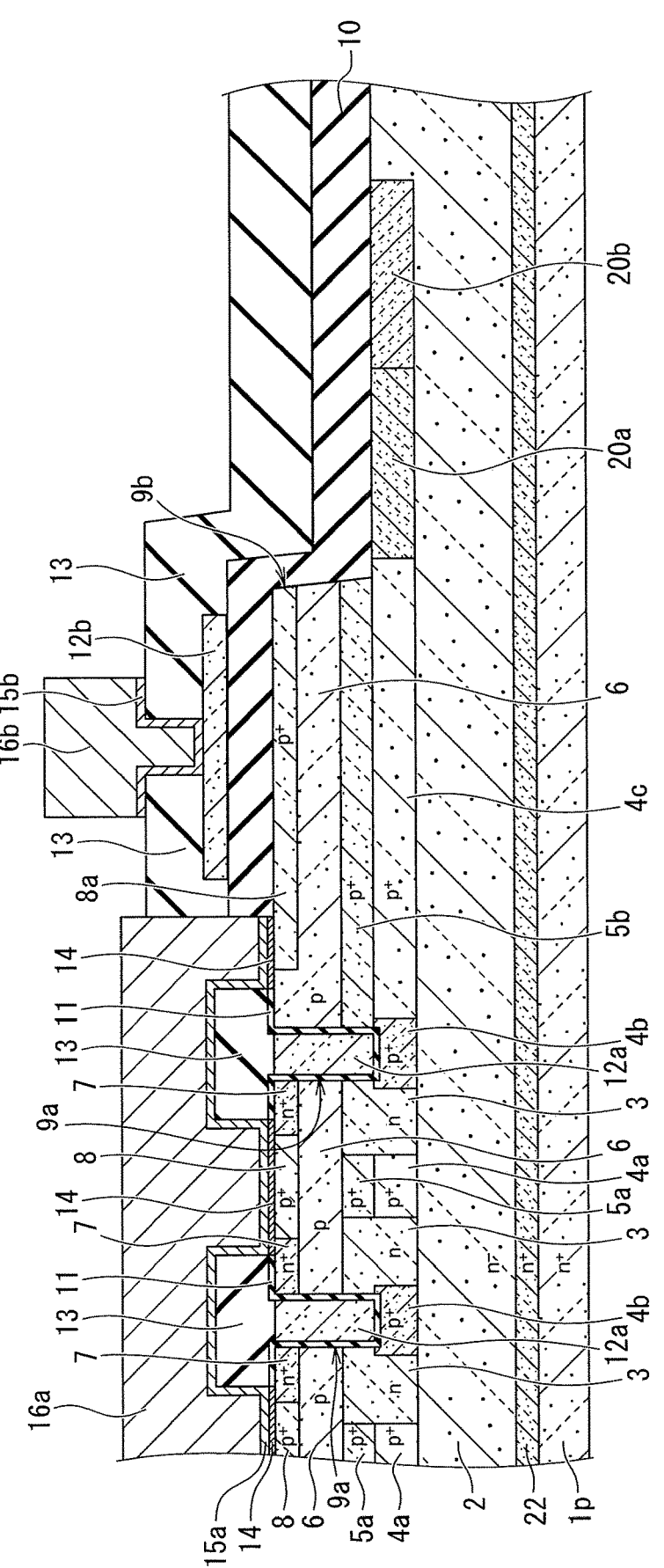
FIG. 14 is a schematic cross-sectional view illustrating an example of a process following FIG. 13 in the manufacturing method of the semiconductor device according to the embodiment of the present invention.

A metallic layer, such as a Ni film and the like, is deposited by sputtering method, evaporation method and the like, and a pattern is delineated on the deposited metallic layer by photolithography technology, RIE technology and the like. Thereafter, the source contact layer 14 is formed by rapid thermal annealing (RTA), for example, at about 1000° C. Then, a metallic layer, such as a TiN film and the like, is deposited by sputtering method and the like, and a pattern is delineated on the deposited metallic layer by photolithography technology, RIE technology and the like, to form the barrier-metal layers 15a, 15b. As a result, as illustrated in FIG. 14, the source contact layer 14 is formed on the top surfaces of the source region 7 and the base contact region 8, and the barrier-metal layer 15a is formed so as to cover the interlayer insulating film 13. Further, the barrier metal layer 15b is formed on the top surface of the interconnection layer 12b exposed in the interlayer insulating film 13. Then, a metallic layer, such as an Al film and the like, is deposited by sputtering method and the like. Patterns are delineated on the metallic layer such as the Al film by photolithography technology, RIE technology and the like, to form the source electrode 16a, the gate electrode pad 16b and the gate surface electrode (not illustrated). Thus, the patterns of the source electrode 16a and the gate surface electrode are separated, and the gate electrode pad 16b is electrically connected to the gate electrode 12a via the interconnection layer 12b.

Figure 15:
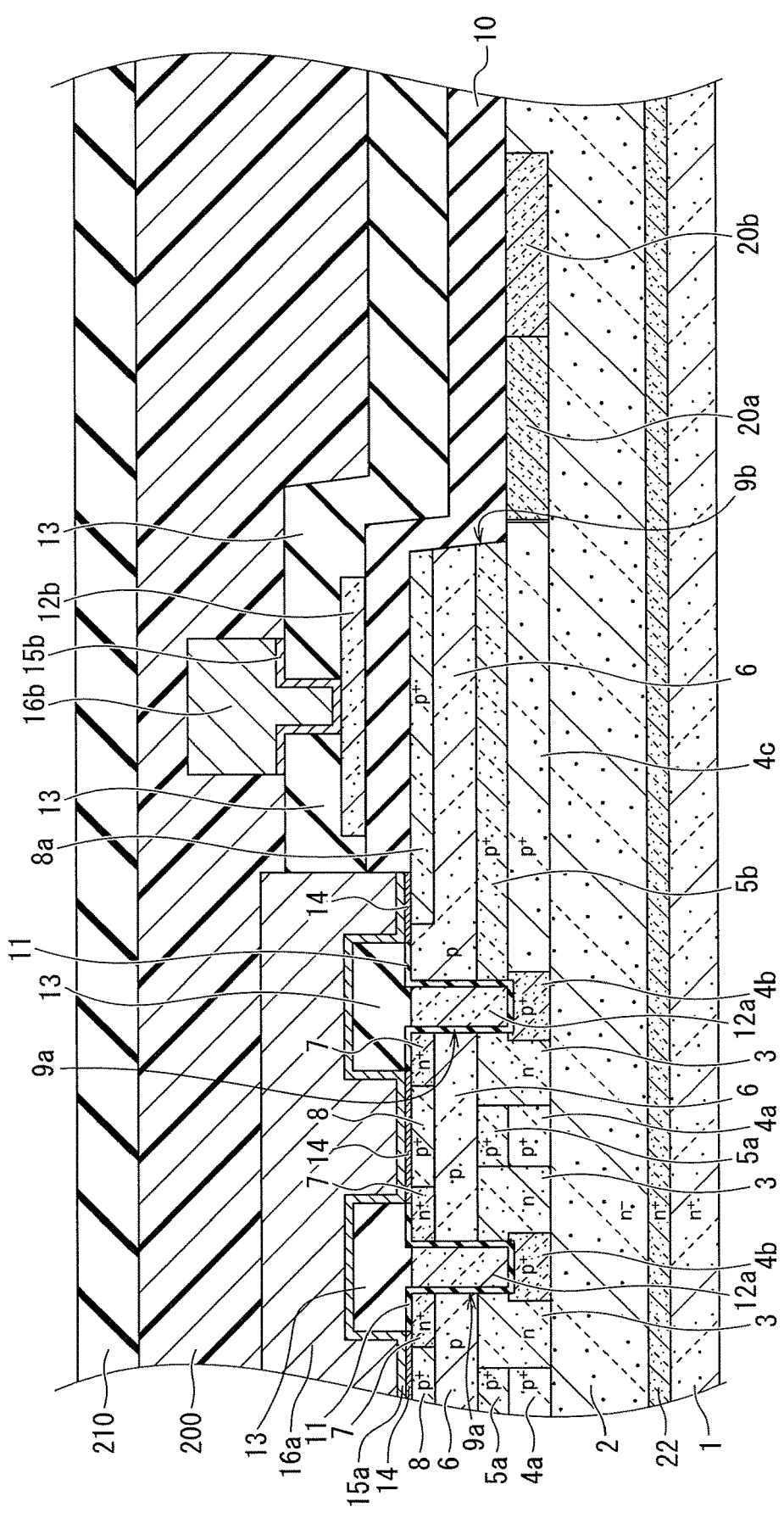
FIG. 15 is a schematic cross-sectional view illustrating an example of a process following FIG. 14 in the manufacturing method of the semiconductor device according to the embodiment of the present invention.
Figure 16:
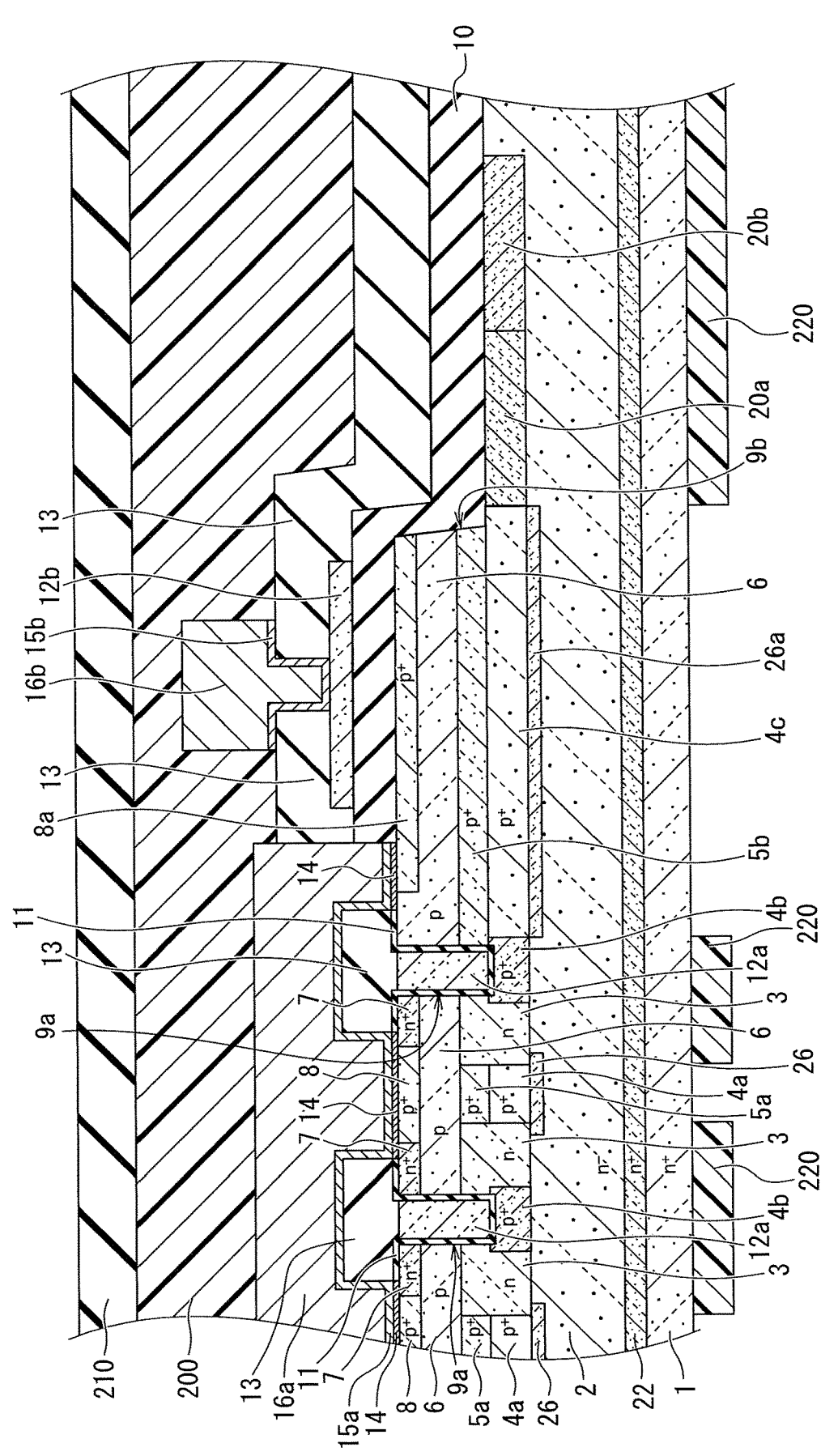
FIG. 16 is a schematic cross-sectional view illustrating an example of a process following FIG. 15 in the manufacturing method of the semiconductor device according to the embodiment of the present invention.

Next, as illustrated in FIG. 15, an adhesive 200 is applied to an upper side of the substrate 1p on which the element structure is formed and the substrate 1p is bonded to the glass plate 210 using the adhesive 200. The bottom surface of the substrate 1p is polished by chemical mechanical polishing (CMP) technology and the like to adjust the thickness to 100 μm or less, for example, about 50 μm, thereby forming the drain region 1. Thereafter, a photoresist film is applied to a bottom surface of the drain region 1, and a photoresist pattern 220 is delineated on the photoresist film by photolithography technology and the like. Using the delineated photoresist pattern 220 as an ion-implantation mask, protons (hydrogen (H) ions) or helium (He) ions are selectively implanted in the upper portion of the drift layer 2 by multiple-energy ion implantation. As a result, as illustrated in FIG. 16, the upper recombination region 26 to contact the first embedded region 4a and the upper recombination region 26a to contact the first embedded region 4c are selectively formed in the upper portion of the drift layer 2, respectively. The width of the upper recombination region 26 is made wider than the width of the bottom surface of the first embedded region 4a so that the upper recombination region 26 is formed to cover the bottom edge of the first embedded region 4a.

Figure 17:
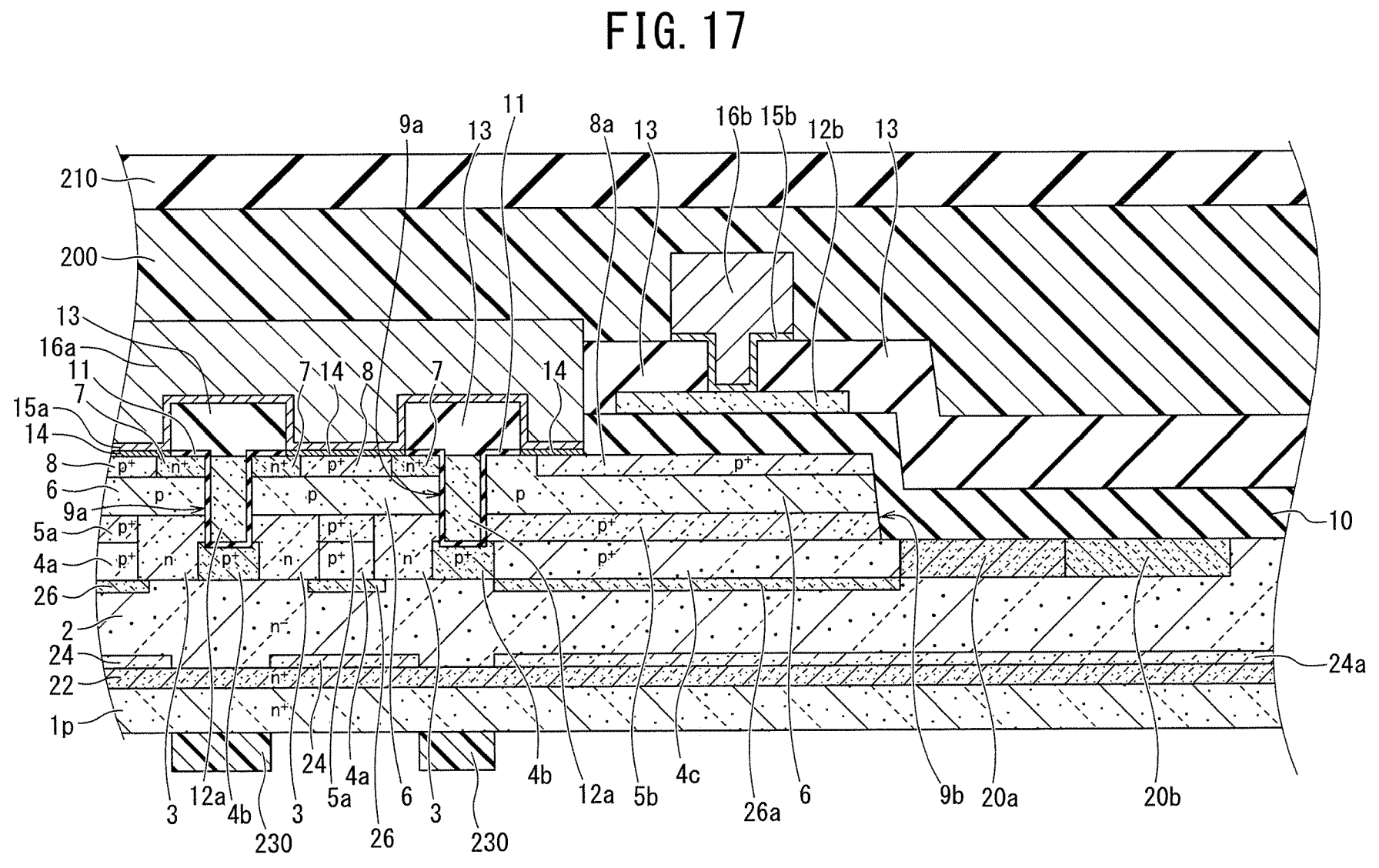

Subsequently, after removing the photoresist pattern 220, a photoresist film is applied to the bottom surface of the drain region 1, and a photoresist pattern 230 is delineated on the photoresist film by photolithography technology and the like. Using the delineated photoresist pattern 230 as an ion-implantation mask, protons (hydrogen (H) ions) or helium (He) ions are selectively implanted into the lower portion of the drift layer 2 by multiple-energy ion implantation. As a result, as shown in FIG. 17, the lower recombination regions 24 and 24a are formed in the lower portion of the drift layer 2 so as to contact the upper surface of the buffer layer 22. The bottoms of the lower recombination regions 24, 24a may be separated from the buffer layer 22 in a range of 3 μm or less. The lower recombination region 24 is selectively formed below the first embedded region 4a so that a region immediately below the gate-bottom protection region 4b is aligned with a space between the adjacent lower recombination regions 24. The lower recombination region 24a is formed so as to extend from below the first embedded region 4c into the outer-edge area 101b.

After removing the photoresist pattern 230, the adhesive 200 is removed to separate the element structure from the glass plate 210. The drain electrode 17 made of Au or the like is formed on the entire surface of the bottom surface of the drain region 1 by sputtering method, evaporation method and the like. Thus, the trench-gate semiconductor device illustrated in FIG. 2 is completed.

In the manufacturing method of the semiconductor device according to the embodiment, the process of generating the crystal defects for recombining the holes is carried out after the process including high-temperature annealing, such as the activation of implanted impurity ions, the electrode formation and the like. Therefore, it is possible to prevent the disappearance of the generated crystal defects by the high-temperature annealing. Further, since the drain region 1 is formed by polishing the substrate 1p to a thickness of 100 μm or less, the light element ions, such as hydrogen, helium and the like, can be implanted into the drift layer 2 from the bottom surface of the drain region 1 with a high concentration and good reproducibility.

Figure 18:
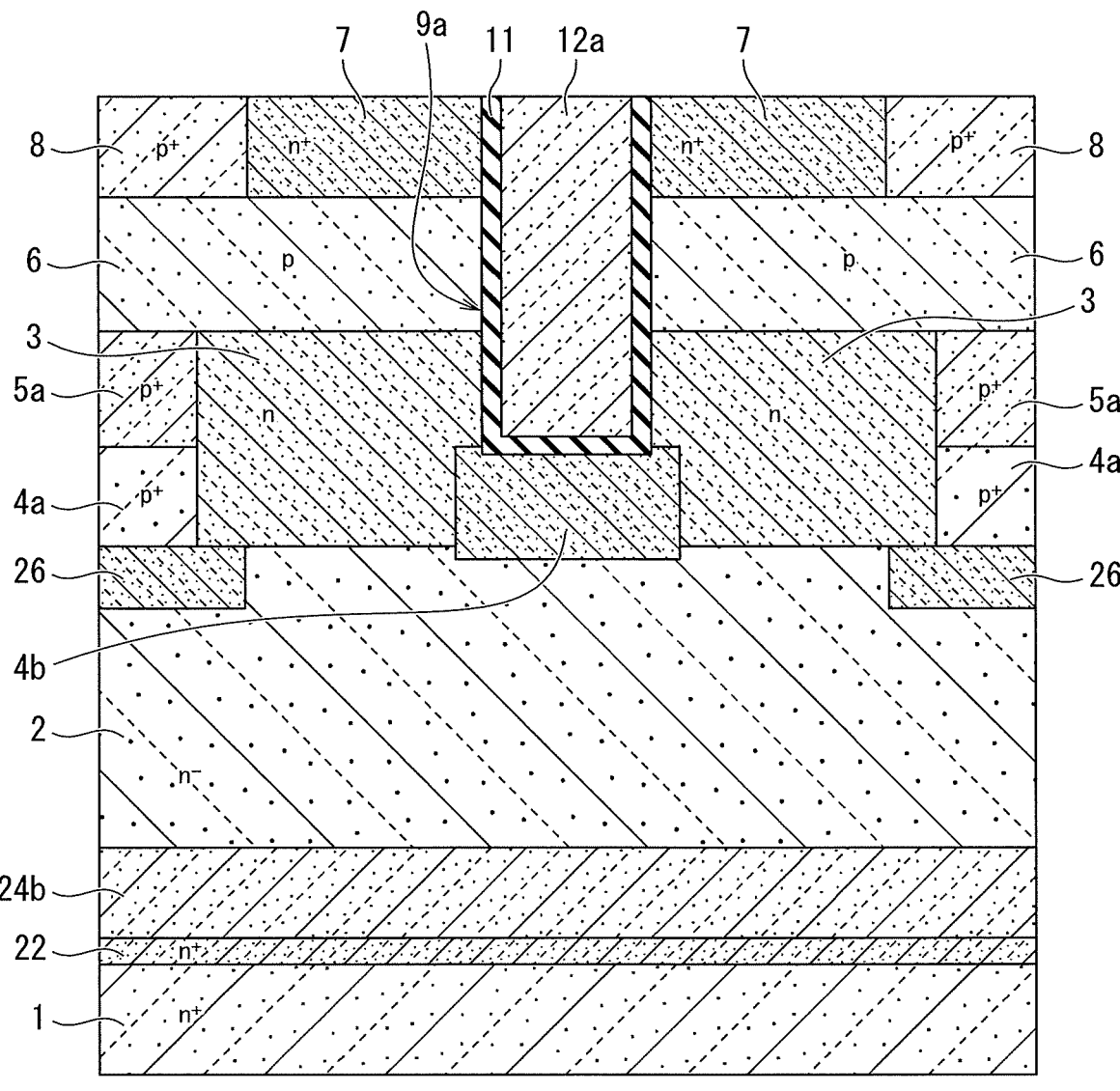
FIG. 18 is a schematic plan view illustrating another example of a semiconductor device according to the embodiment of the present invention.

In the above description, the lower recombination region 24 in the semiconductor device according to the embodiment shown in FIG. 2 is selectively formed at the bottom portion of the drift layer 2 so as to be positioned below the first embedded region 4a. However, as illustrated in FIG. 18, a lower recombination region 24b in contact with the upper surface of the buffer layer 22 may be formed on the entire lower portion of the drift layer 2. In such case, although it is possible to increase the recombination of holes in the lower recombination region 24b, it is likely to increase the on-resistance of the MOSFET and the forward voltage of the built-in diode. Therefore, it is desirable to reduce the area density of crystal defects included in the lower recombination region 24b or to reduce the thickness of the lower recombination region 24b. The lower recombination region 24b may extend to the outer-edge area 101b.

Figure 19:
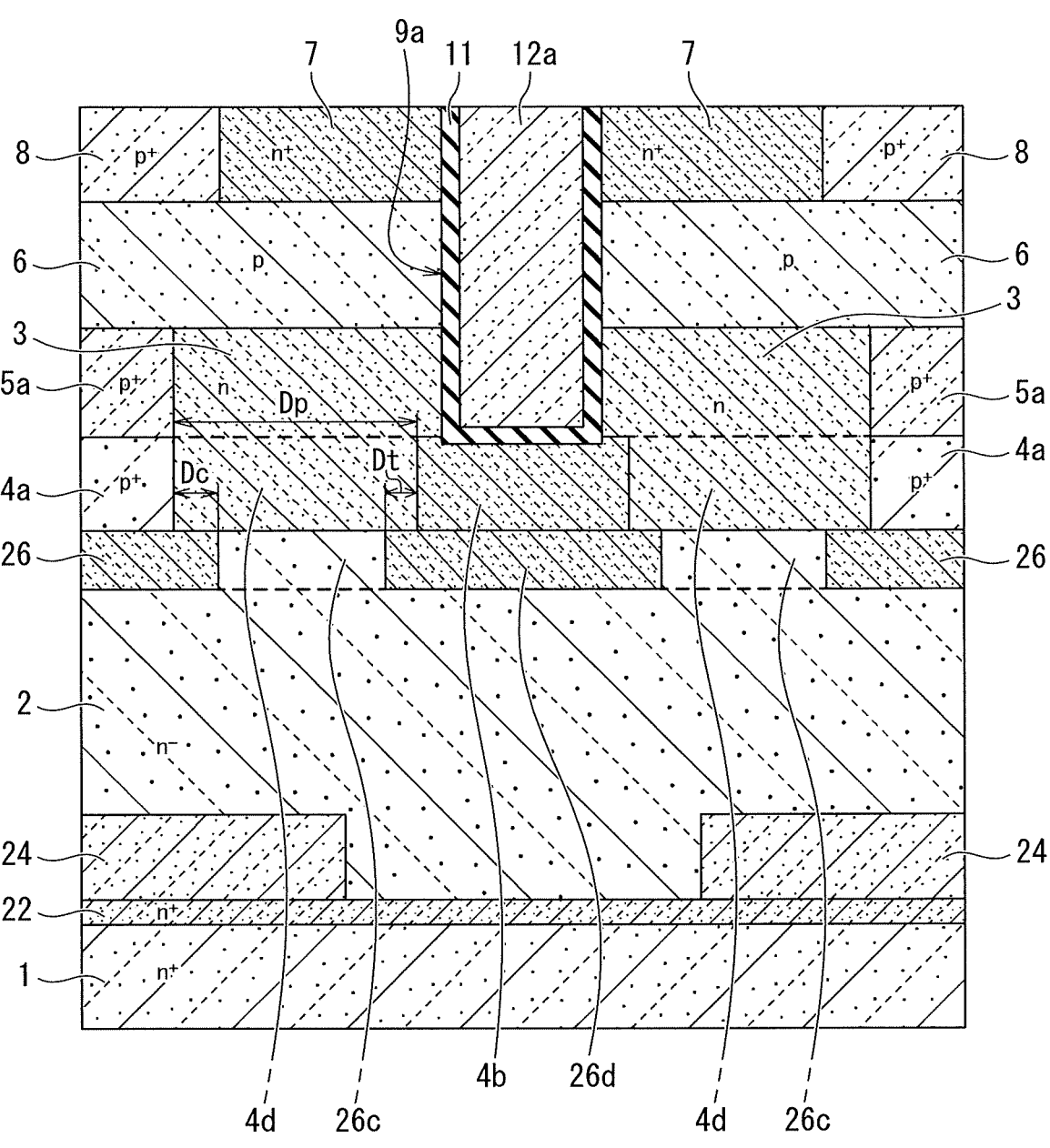
FIG. 19 is a schematic plan view illustrating another example of a semiconductor device according to the embodiment of the present invention.

Further, as illustrated in FIG. 19, an upper recombination region (a gate-bottom recombination region) 26d may be formed so as to contact the bottom surface of the gate-bottom protection region 4b. The upper recombination region 26d is disposed apart from the upper recombination region 26. A width of the upper recombination region 26d is made wider than that of the gate-bottom protection region 4b so as to cover the bottom edge of the gate-bottom protection region 4b by the upper recombination region 26d. The gate-bottom protection region 4b may be used in a floating state but is generally connected to the first embedded region 4a of the base-bottom embedded region (4a, 5a). In the present embodiment, the gate-bottom protection region 4b and the first embedded region 4a are connected by the connecting portion 4d, and an upper recombination region 26c may also be formed on the bottom of the connecting portion 4d to connect the upper recombination region 26 and the upper recombination region 26d. Thus, by forming the upper recombination regions 26d, 26c, the holes injected into the drift layer 2 from the base region 6 via the gate-bottom protection region 4b can be decreased due to recombination in the upper recombination region 26d. A protrusion width Dt of the upper recombination region 26d protruding from a side surface of the gate-bottom protection region 4b toward the first embedded region 4a is preferably greater than 0 and a half of the current spreading width Dp or less. In such a range, it is possible to increase the recombination of holes and to prevent from increasing the on-resistance of the MOSFET and the forward voltage of the built-in diode. The thicknesses of the upper recombination regions 26d, 26c and the area density of the implanted light element ions may be the same as those of the upper recombination region 26.

Figure 20:
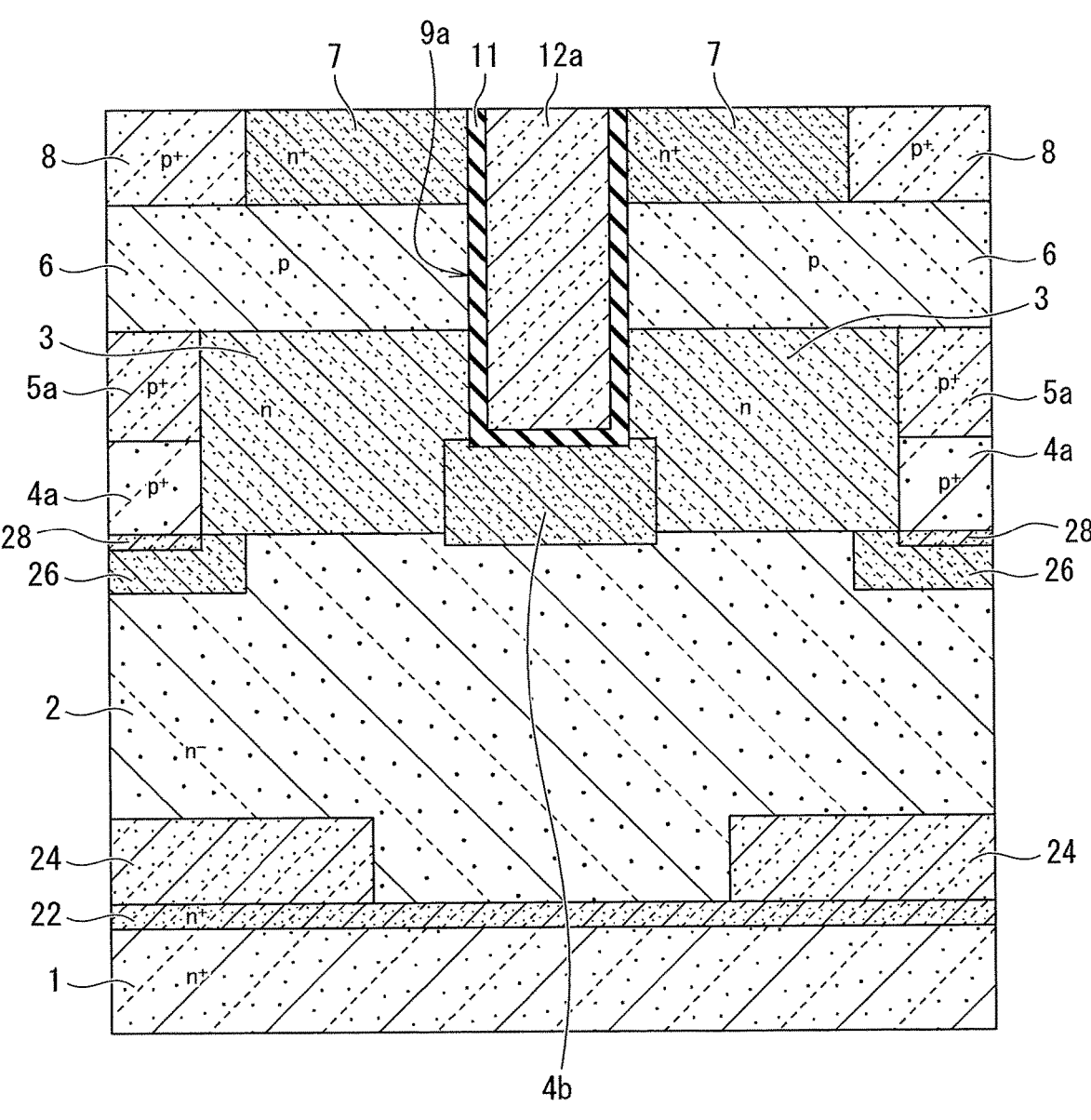
FIG. 20 is a schematic plan view illustrating another example of a semiconductor device according to the embodiment of the present invention.

As illustrated in FIG. 20, an n$^+$-type local current spreading layer 28 may be formed in an upper portion of the upper recombination region 26 so as to contact the bottom surface of the first embedded region 4a. For example, an impurity concentration of the local current spreading layer 28 is $5\times10^{17}$ cm$^{-3}$ or more and $\times10^{19}$ cm$^{-3}$ or less. The local current spreading layer 28 can reduce the injection of holes from the first embedded region 4a, in addition to having a current spreading function.

Other Embodiments

While the SiC semiconductor device according to the embodiment of the present invention has been described, it should be understood that the present invention is not intended to be limited to the descriptions of the specification and the drawings implementing part of this disclosure. Various alternative embodiments, examples, and technical applications will be apparent to those skilled in the art according to this disclosure.

Figure 21:
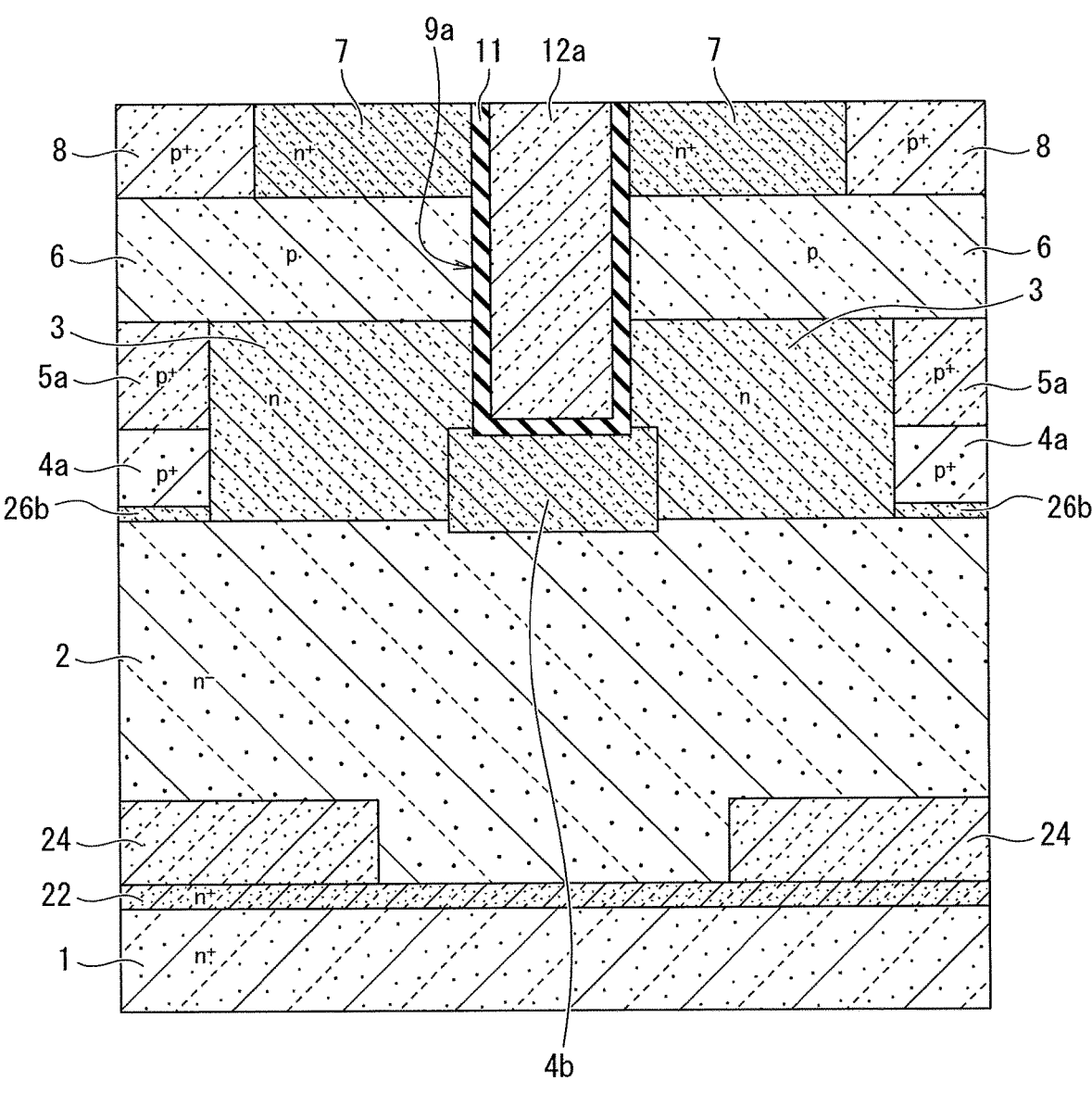
FIG. 21 is a schematic plan view illustrating an example of a semiconductor device according to other embodiment of the present invention.
Figure 22:
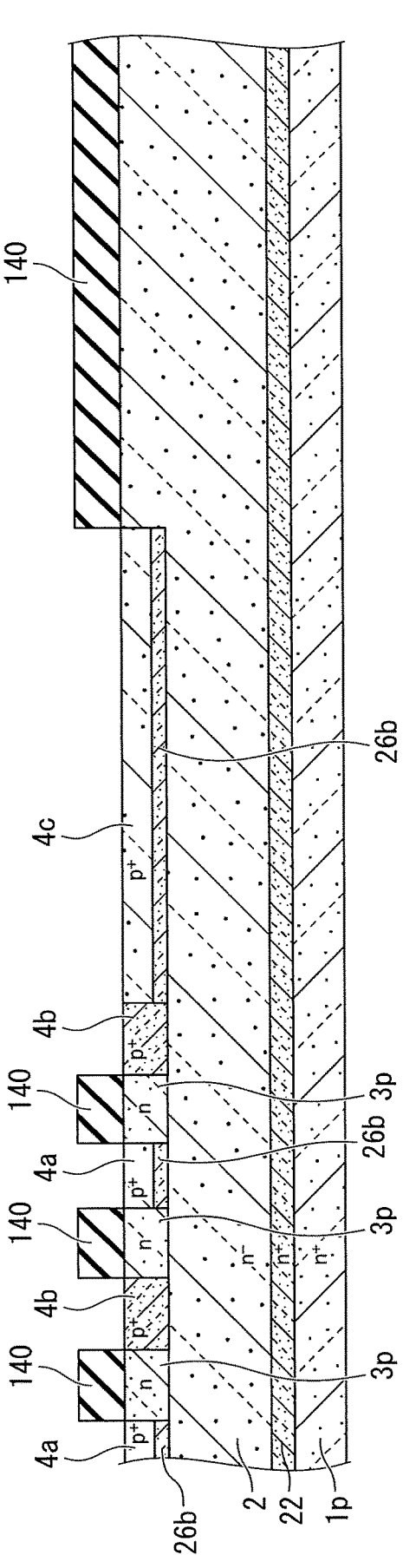
FIG. 22 is a schematic plan view illustrating an example of a process for fabricating the recombination region in the semiconductor device according to the other embodiment of the present invention.

As described above, in the embodiment, the ions of light element, such as hydrogen (H), helium (He)and the like, are used to generate the crystal defects, but the ions are not limited. For example, ions of heavy metal, such as titanium (Ti), vanadium (V), chromium (Cr), manganese (Mn), iron (Fe), platinum (Pt), gold (Au) and the like, may be used. As illustrated in FIG. 21, an upper recombination region 26b using the heavy metal ions is preferably formed so that the crystal defects are localized at a lower portion of the first embedded region 4a of the base-bottom embedded region (4a, 5a). When the heavy metal ions are used, it is difficult to execute ion implantation from the bottom surface of the drain region 1 as illustrated in FIG. 16, because implantation depths of the implanted ions are decreased. Therefore, as illustrated in FIG. 22, before the process of implanting p-type impurity ions in the first embedded region 4a illustrated in FIG. 8, the heavy metal ions are implanted to form the upper recombination region 26b. The oxide pattern 140 can be used as an ion-implantation mask. Since the implanted heavy metals themselves implement crystal defects, the crystal defects remain even after the high-temperature process such as an activation annealing and the like. The implantation of heavy metal ions may be executed immediately after the implantation of p-type impurity ions of the first embedded region 4a.

As described above, it should be noted that the present invention includes various embodiments, which are not disclosed herein, including elements optionally modified as alternatives to those illustrated in the above embodiments and modified examples. Therefore, the scope of the present invention is defined only by the technical features specifying the invention prescribed by the claims reasonably derived from the description heretofore.

What is claimed is:

1. A silicon carbide semiconductor device comprising:
a drift layer of a first conductivity type above a silicon carbide substrate of the first conductivity type;
a current spreading layer of the first conductivity type on a top surface of the drift layer, having a higher impurity concentration than the drift layer;
a base region of a second conductivity type on a top surface of the current spreading layer;
a gate-bottom protection region of the second conductivity type located in the current spreading layer;
a base-bottom embedded region of the second conductivity type located in the current spreading layer, separated from the gate-bottom protection region to be in contact with a bottom surface of the base region;
an insulated-gate electrode structure in a trench penetrating the base region to reach the gate-bottom protection region;
a lower recombination region in a lower portion of the drift layer, including crystal defects configured to recombine minority carriers injected into the drift layer; and
an upper recombination region on a bottom surface of the base-bottom embedded region so as to be in direct contact with the bottom surface of the base-bottom embedded region without an intervening layer between an upper surface of the upper recombination region and the bottom surface of the base-bottom embedded region, the upper recombination region including crystal defects configured to recombine minority carriers injected from the base region.

2. The silicon carbide semiconductor device of claim 1, wherein the upper recombination region has recombination centers provided with hydrogen or helium as the crystal defects and is disposed in an upper portion of the drift layer so as to cover the bottom surface of the base-bottom embedded region and a bottom edge of the base-bottom embedded region.

3. The silicon carbide semiconductor device of claim 1, wherein
   a side surface of the upper recombination region protrudes by a protrusion width toward a side of the gate-bottom protection region, the protrusion width being less than half of a distance between the base-bottom embedded region and the gate-bottom protection region.

4. The silicon carbide semiconductor device of claim 3, wherein the upper recombination region has an area density of crystal defects in a range of $5\times10^{10}$ cm$^{-2}$ or more and $2\times10^{11}$ cm$^{-2}$ or less, and a thickness in range of 0.2 μm or more and 0.5 μm or less.

5. The silicon carbide semiconductor device of claim 1, wherein the lower recombination region has recombination centers provided with hydrogen or helium as the crystal defects and is selectively below the base-bottom embedded region.

6. The silicon carbide semiconductor device of claim 1, wherein the lower recombination region is on an entire bottom surface of the drift layer.

7. The silicon carbide semiconductor device of claim 1, further comprising a gate-bottom recombination region covering the bottom surface of the gate-bottom protection region and a bottom edge of the gate-bottom protection region, including crystal defects configured to recombine minority carriers.

8. The silicon carbide semiconductor device of claim 1, wherein the upper recombination region extends so as to be entirely in contact with a bottom surface of the base-bottom embedded region that extends from an end of an active area including the insulated-gate electrode structure is disposed to an outer-edge area that is around the active area.

9. The silicon carbide semiconductor device of claim 1, wherein the upper recombination region has recombination centers provided with at least one heavy metal selected from titanium, vanadium, chromium, manganese, iron, platinum and gold as the crystal defects, and the upper recombination region is localized at a lower portion of the base-bottom embedded region.

10. The silicon carbide semiconductor device of claim 1, further comprising a buffer layer of the first conductivity type on a top surface of the silicon carbide substrate so as to contact a bottom surface of the drift layer, having a higher impurity concentration than the drift layer.

11. A silicon carbide semiconductor device comprising:
   a drift layer of a first conductivity type above a silicon carbide substrate of the first conductivity type;
   a current spreading layer of the first conductivity type on a top surface of the drift layer, having a higher impurity concentration than the drift layer;
   a base region of a second conductivity type on a top surface of the current spreading layer;
   a gate-bottom protection region of the second conductivity type located in the current spreading layer;
   a base-bottom embedded region of the second conductivity type located in the current spreading layer, separated from the gate-bottom protection region to be in contact with a bottom surface of the base region;

an insulated-gate electrode structure in a trench penetrating the base region to reach the gate-bottom protection region; and
   a lower recombination region in a lower portion of the drift layer and selectively below the base-bottom embedded region, including crystal defects configured to recombine minority carriers injected into the drift layer, and having recombination centers provided with hydrogen or helium as the crystal defects, wherein
      a space between the lower recombination region and another lower recombination region adjacent to the lower recombination region is aligned so as to face the gate-bottom protection region, and
      a width of the space is larger than a width of the gate-bottom protection region, and in a plan view, an end of the lower recombination region is positioned on a side of the gate-bottom protection region between the base-bottom embedded region and the gate-bottom protection region.

12. The silicon carbide semiconductor device of claim 11, further comprising:
   an upper recombination region on a bottom surface of the base-bottom embedded region, and
   a local current spreading layer of the first conductivity type in an upper portion of the upper recombination region and in contact with the bottom surface of the base-bottom embedded region.

13. A silicon carbide semiconductor device comprising:
   a drift layer of a first conductivity type above a silicon carbide substrate of the first conductivity type;
   a current spreading layer of the first conductivity type on a top surface of the drift layer, having a higher impurity concentration than the drift layer;
   a base region of a second conductivity type on a top surface of the current spreading layer;
   a gate-bottom protection region of the second conductivity type located in the current spreading layer;
   a base-bottom embedded region of the second conductivity type located in the current spreading layer, separated from the gate-bottom protection region to be in contact with a bottom surface of the base region;
   an insulated-gate electrode structure in a trench penetrating the base region to reach the gate-bottom protection region; and
   a lower recombination region in a lower portion of the drift layer, including crystal defects configured to recombine minority carriers injected into the drift layer, wherein the lower recombination region has an area density of the crystal defects in a range of $5\times10^{11}$ cm$^{-2}$ or more and $2\times10^{12}$ cm$^{-2}$ or less, and a thickness in range of 0.5 μm or more and 1.0 μm or less.

14. A method for manufacturing a silicon carbide semiconductor device comprising:
   forming an element structure in an active area of a silicon carbide substrate of a first conductivity type, the element structure including,
      a drift layer of the first conductivity type epitaxially grown on the silicon carbide substrate,
      a current spreading layer of the first conductivity type on a top surface of the drift layer, having a higher impurity concentration than the drift layer,
      a base region of a second conductivity type on a top surface of the current spreading layer,
      a gate-bottom protection region of the second conductivity type located in the current spreading layer,
      a base-bottom embedded region of the second conductivity type located in the current spreading layer, separated from the gate-bottom protection region to be in contact with a bottom surface of the base region, and an insulated-gate electrode structure in a trench penetrating the base region to reach the gate-bottom protection region, polishing a bottom surface of the silicon carbide substrate, after forming the element structure; and selectively implanting hydrogen ions or helium ions into a lower portion of the drift layer from the polished bottom surface of the silicon carbide substrate to selectively form a lower recombination region, which includes crystal defects for recombining minority carriers, in the lower portion of the drift layer; and selectively implanting ions into an upper portion of the drift layer from the polished bottom surface of the silicon carbide substrate to selectively form an upper recombination region on a bottom surface of the base-bottom embedded region so as to be in direct contact with the bottom surface of the base-bottom embedded region without an intervening layer between an upper surface of the upper recombination region and the bottom surface of the base-bottom embedded region, the upper recombination region including crystal defects for recombining minority carriers.

15. The method of claim 14, wherein the selectively implanting ions includes, selectively implanting hydrogen ions, helium ions, or ions of a heavy metal.

16. The method of claim 15, wherein the upper recombination region is formed so as to cover the bottom surface of the base-bottom embedded region and a bottom edge of the base-bottom embedded region.

17. The method of claim 14, wherein the lower recombination region is selectively formed below the base-bottom embedded region.

* * * * *